(12) United States Patent
Samake

(10) Patent No.: US 11,863,367 B2
(45) Date of Patent: Jan. 2, 2024

(54) METHODS OF USING PHASES TO REDUCE BANDWIDTHS OR TO TRANSPORT DATA WITH MULTIMEDIA CODECS USING ONLY MAGNITUDES OR AMPLITUDES

(71) Applicant: Georges Samake, Pontault Combault (FR)

(72) Inventor: Georges Samake, Pontault Combault (FR)

( * ) Notice: Subject to any disclaimer, the term of this patent is extended or adjusted under 35 U.S.C. 154(b) by 16 days.

(21) Appl. No.: 17/407,620

(22) Filed: Aug. 20, 2021

(65) Prior Publication Data

US 2023/0054828 A1    Feb. 23, 2023

(51) Int. Cl.
*H04L 27/26* (2006.01)
*H04B 1/713* (2011.01)

(52) U.S. Cl.
CPC ......... *H04L 27/2639* (2013.01); *H04B 1/713* (2013.01); *H04L 27/2634* (2013.01)

(58) Field of Classification Search
CPC . H04L 27/2639; H04L 27/2634; H04B 1/713; H04N 21/845; H04N 21/8456; H04N 11/042; H04N 1/00; H04N 1/00095; H04N 1/00114; H04N 1/00116; H04N 1/00119; H04N 1/00122; H04N 1/00127; H04N 1/32144; H04N 1/32149; H04N 1/32309; H04N 1/32154; H04N 1/32187; H04N 1/3216; H04N 1/32165
See application file for complete search history.

(56) References Cited

U.S. PATENT DOCUMENTS

| | | | | |
|---|---|---|---|---|
| 7,697,591 B2* | 4/2010 | Copeland | ............... | H04B 1/707 375/130 |
| 8,160,166 B2* | 4/2012 | Moffatt | ................. | H04L 27/262 375/267 |
| 10,075,321 B2* | 9/2018 | Dutronc | ................ | H04L 27/266 |
| 10,195,432 B2* | 2/2019 | Hillbratt | ............ | A61N 1/36038 |
| 10,933,239 B2* | 3/2021 | Hillbratt | ............ | A61N 1/36036 |
| 10,943,599 B2* | 3/2021 | Mitic | ................... | G10L 21/0264 |
| 2004/0052314 A1* | 3/2004 | Copeland | ............... | H04B 1/707 375/296 |
| 2007/0094015 A1* | 4/2007 | Samake | .............. | H03M 7/3053 704/212 |
| 2011/0075851 A1* | 3/2011 | LeBoeuf | ................. | G10L 25/51 381/56 |

(Continued)

*Primary Examiner* — James M Perez

(57) ABSTRACT

Multimedia codecs (compression methods), based only on FFT (Fast Fourier Transform) have been recently proposed. These codecs use the largest points (foreground) and the most energetic bands (background). Medium quality versions are based on the largest local peaks only.
The phases can be ignored with the largest local peaks or in the background. Alternatively, sine and cosine amplitudes can be used.
This invention describes methods for giving utility to the reintroduced phases, in particular: local peaks are grouped to have a very narrow bandwidth, with the phases containing the displacements of these peaks, and we transport data and the points of the foreground in the phases of the background. High speed communications are supported using techniques similar to OFDM (Orthogonal Frequency-Division Multiplexing). These processes are intended to be used in particular with connected objects and in the physical layers of computer networks.

9 Claims, 15 Drawing Sheets

(56) References Cited

U.S. PATENT DOCUMENTS

| | | | |
|---|---|---|---|
| 2012/0102066 A1* | 4/2012 | Eronen | G06F 16/58 |
| | | | 707/769 |
| 2013/0226850 A1* | 8/2013 | Hannuksela | G06F 16/58 |
| | | | 706/14 |
| 2016/0144178 A1* | 5/2016 | Hillbratt | A61N 1/36038 |
| | | | 607/57 |
| 2017/0126459 A1* | 5/2017 | Dutronc | H04L 27/2659 |
| 2019/0111262 A1* | 4/2019 | Hillbratt | A61N 1/36036 |
| 2020/0135224 A1* | 4/2020 | Bromand | H04M 9/08 |
| 2020/0222697 A1* | 7/2020 | Hillbratt | A61N 1/36038 |
| 2021/0157312 A1* | 5/2021 | Cella | G01M 13/045 |
| 2021/0287693 A1* | 9/2021 | Mitic | H04R 3/04 |
| 2022/0108262 A1* | 4/2022 | Cella | G06Q 10/063118 |

* cited by examiner

| Pixel | FFT Bin | Magnitude Mode 1 | Phase Mode 1 | Magnitude Mode 2 | Phase Mode 2 | Magnitude Mode 3 | Phase Mode 3 |
|---|---|---|---|---|---|---|---|
| W | 0 | 10 | 3*PI/4 | 10 | 3*PI/4 | 10 | 0 |
| W | 1 | 10 | 3*PI/4 | 0 | 0 | 10 | 0 |
| W | 2 | 100 | 0 | 0 | 0 | 10 | 0 |
| W | 3 | 10 | 3*PI/4 | 0 | 0 | 10 | 0 |
| W | 4 | 100 | 2*PI/4 | 10 | 3*PI/4 | 10 | 0 |
| W | 5 | 0 | 0 | 0 | 0 | 10 | 0 |
| W | 6 | 0 | 0 | 0 | 0 | 10 | 0 |
| W | 7 | 0 | 0 | 0 | 0 | 10 | 0 |
| B | 8 | 0 | 0 | 100 | 0 | 100 | 0 |
| W | 9 | 0 | 0 | 10 | 3*PI/4 | 10 | 0 |
| W | 10 | 0 | 0 | 0 | 0 | 10 | 0 |
| W | 11 | 0 | 0 | 0 | 0 | 10 | 0 |
| W | 12 | 0 | 0 | 0 | 0 | 10 | 0 |
| B | 13 | 0 | 0 | 100 | 2*PI/4 | 100 | 2*PI/4 |
| B | 14 | 0 | 0 | 0 | 0 | 0 | 0 |
| B | 15 | 0 | 0 | 0 | 0 | 0 | 0 |

| Character | Total Count | Huffman Code | FFT Bin | Magnitude | Phase |
|---|---|---|---|---|---|
| M | 1 | 100 | 0 | 100 | 0 |
| i | 4 | 0 | 1 | 10 | 0 |
| s | 4 | 11 | 2 | 20 | 0 |
| s | 4 | 11 | 3 | 20 | 0 |
| i | 4 | 0 | 4 | 10 | 0 |
| s | 4 | 11 | 5 | 20 | 0 |
| s | 4 | 11 | 6 | 20 | 0 |
| i | 4 | 0 | 7 | 10 | 0 |
| p | 2 | 101 | 8 | 50 | PI/2 |
| p | 2 | 101 | 9 | 0 | 0 |
| i | 4 | 0 | 10 | 10 | 0 |

FIG. 20

METHODS OF USING PHASES TO REDUCE BANDWIDTHS OR TO TRANSPORT DATA WITH MULTIMEDIA CODECS USING ONLY MAGNITUDES OR AMPLITUDES

CROSS-REFERENCE TO RELATED APPLICATION

This application claims priority to and the benefit of the filing date of U.S. provisional application No. 63/072,191, filed on Aug. 30, 2020, entitled "Methods of using phases to reduce bandwidths or to transport data with multimedia codecs using only magnitudes or amplitudes", which is hereby incorporated in its entirety.

BACKGROUND OF THE INVENTION

Multimedia codecs (audio, image and video compression methods), based solely on FFT (Fast Fourier Transform) have been recently proposed. These codecs use the largest points (foreground) and the most energetic bands (background). Medium quality versions are based on the largest local peaks only.

The phases can be ignored with the largest local peaks or in the background. Alternatively, sine and cosine amplitudes can be used. In this case, the phases are not directly taken into account but can be recalculated from these amplitudes.

Nowadays, most high-speed communications use FFT via a variant of OFDM (Orthogonal Frequency-Division Multiplexing). Good frequency ranges available for OFDM communications are becoming increasingly rare. Huge ranges exist but are hardly usable: the communications do not go far, require a lot of antennas or a lot of power consumption.

BRIEF SUMMARY OF THE INVENTION

This invention describes methods and procedures for giving utility to the reintroduced phases, in particular:
  Local peaks are grouped to have a very narrow bandwidth, with the phases associated with the local peaks containing the displacements of those peaks. In other words, if the phases are not directly used, they are added, the local peaks are grouped so as to have a very narrow bandwidth, with the phases associated with the local peaks containing the displacements of those peaks.
  The data are transported in the phases, between two multimedia frames or in the background.
  We leave the points in their place and we store the data in the phases.
  We transport the points of the foreground in the phases of the background.
  The transmissions are carried out in the time domain after inverse FFT.
  High-speed communications are supported using techniques similar to OFDM (Orthogonal Frequency-Division Multiplexing) or F-OFDM (Filtered-OFDM).
  These processes and methods, at low speed, low consumption, low radiation and supporting high speed, are intended to be used in particular with connected objects, in data storage, in the physical layers of computer networks and in blockchain technologies.

BRIEF DESCRIPTION OF THE DRAWINGS

FIG. 20: an example of mapping of a Huffman output to a FFT output.

DETAILED DESCRIPTION OF THE INVENTION

Figure 1:
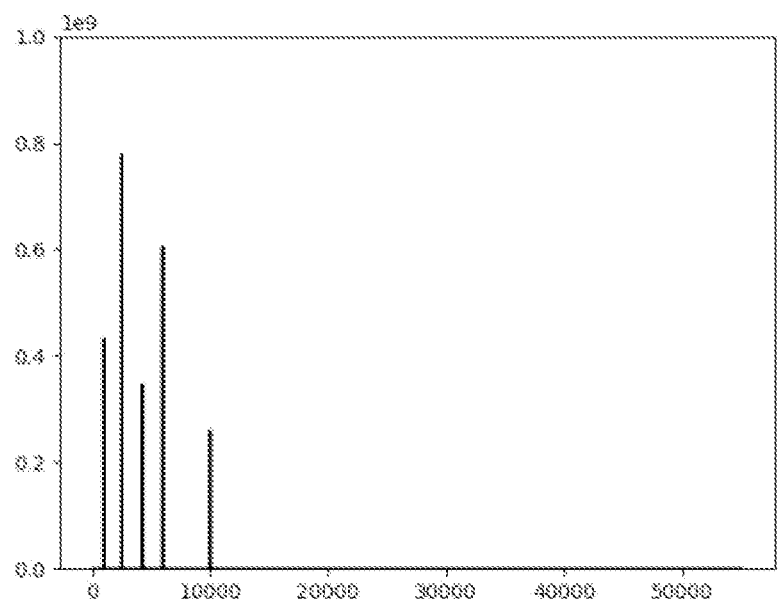
FIG. 1: normalized signal, composed of 5 points with zero phase, representation in the frequency domain.
Figure 2:
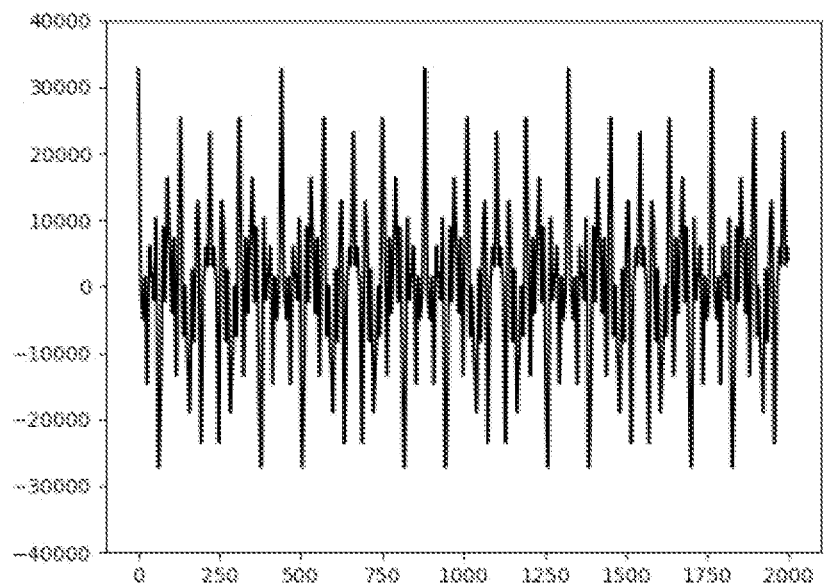
FIG. 2: the same signal in the time domain.
Figure 3A:
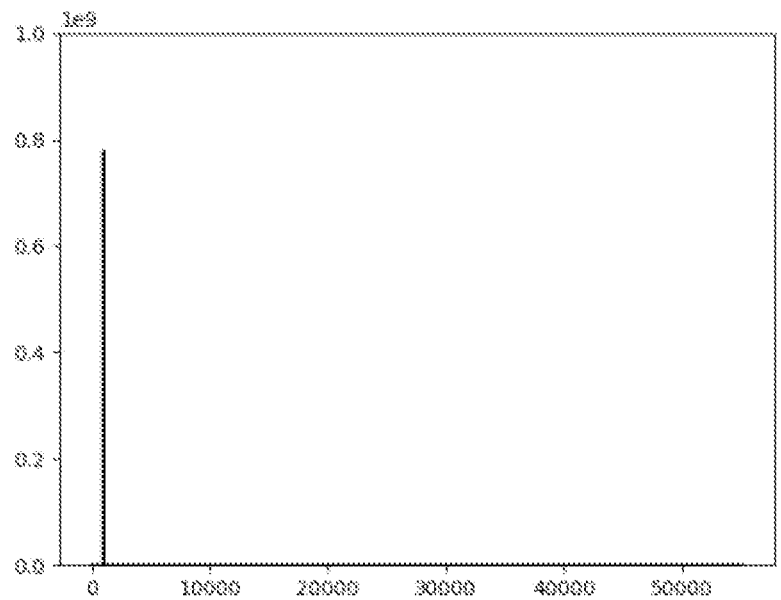
FIG. 3a: maximum reconciliation of the points, the phases containing the original positions of the points, relative to the first point, in the frequency domain.
Figure 3B:
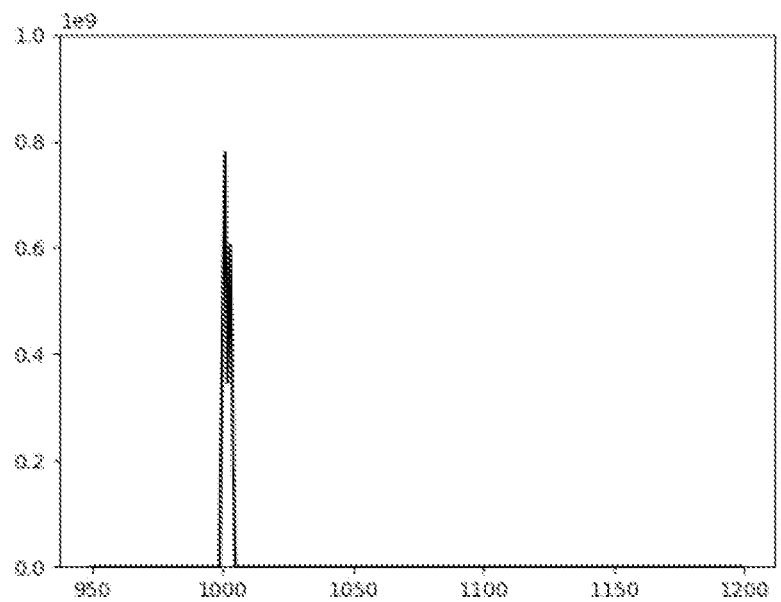
FIG. 3b: more detailed view in the frequency domain.
Figure 4:
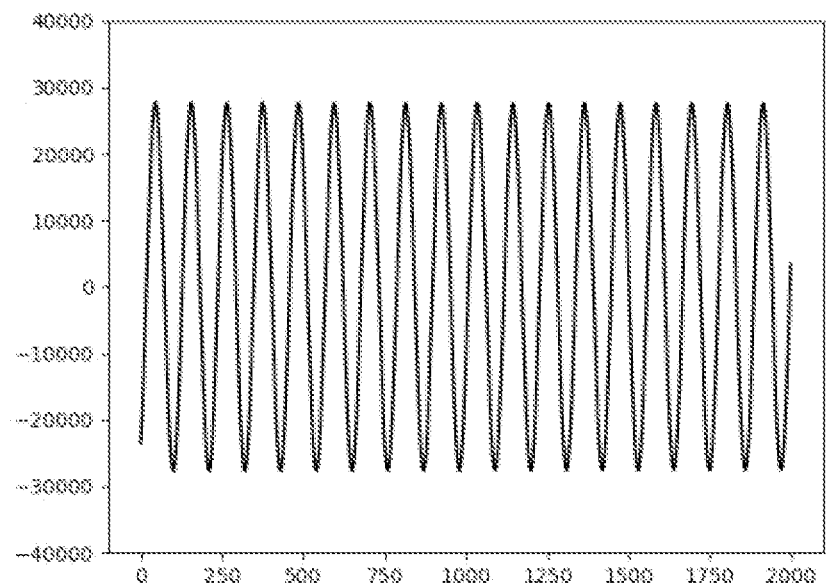
FIG. 4: resulting signal, in the time domain.

Nowadays, information is transported or stored in analog or digital form. Digital has appeared more recently with computing and tends to replace analog in transport and storage. Data in multimedia codecs, which operate in blocks, are transported and stored in digital form.

Although the carriers and physical media for communication have remained analog, the underlying modulations are digital, with no connection to the codec-related blocks. While the envelopes containing the codecs may carry data, the codecs themselves do not.

Among other things, this invention proposes an alternative using analog or digital modulations to transport and store multimedia codec data and data in general, in order to communicate using ultra-narrow bandwidths and to increase storage capacities. Codec-related blocks are taken into account for maximum efficiency. Phases that have been ignored in some cases to improve compression efficiency have been reintroduced to play another very important role.

This invention presents an additional processing method applied to multimedia codecs, audio, image and video compression methods, based solely on FFT, Fast Fourier Transform, using the largest points, the foreground, and the most energetic bands, the background, being able to use only a field of local peaks, with or without phases, and being able to ignore the phases in the background, characterized in that phases are added and used to carry data or the values of the displacements of the points or local peaks.

This method comprises adding phases and using them to transport the values of the displacements of the local points and peaks in order to reduce the bandwidths, and adding phases in the background and using them to transport the points of the foreground in order to reduce the crest factor.

This invention is based on three French patents and one French patent application.

The first patent has a filing date of Aug. 3, 2006, filing number: FR0607091, publication number: FR2891100.

To compress audio, voice and music frames, FFT is used, the largest points (foreground) and the most energetic bands (background).

A field of local peaks only can be used. In the general case, there is a frame overlap of 50% or less.

The phases of the foreground points are taken into account in the general case. For low quality voice, the local peaks can be used without phase and without frame overlap.

The background bands are coded with less precision than the foreground points. One can be satisfied with a sign bit for the phases, or even simply ignore the phases. If we take enough points in the foreground, the background looks like a low amplitude white noise.

To encode the phases, we choose a precision, for example four bits per phase (the phases will be between 0 and 15 by applying a simple rule of three), six bits per phase (the phases will be between 0 and 63), eight bits per phase (the phases will be between 0 and 255).

It should be noted that these compressed frames can be used as simple signatures towards richer frames, thus of higher quality.

The second patent has a filing date of Jun. 21, 2012, filing number: FR1201759, publication number: FR2992458.

The compression methods in this patent allow for more compression of audio frames by taking advantage of successive and non-successive redundancies. For successive redundancies, no frame is transmitted, the receiver repeats the last received frame until a repetition credit is exhausted or until it receives a new frame. For non-successive redundancies, the transmitter only sends the number of a similar frame located behind.

It should be noted that these compression methods allow very low latency times while having very high average compression rates.

It should also be noted that for images and video, in k-space, the further away from the center, the more redundant the lines tend to be. These compression methods can still be applied for magnitudes.

Since similar consecutive frames are not transmitted, at the level of transmission protocols, nothing can be modulated (complete silences) and not only the emissions can be reduced, but also the electromagnetic radiation if it is used.

The third patent has a filing date of 4 Mar. 2014, filing number: FR1400535, publication number: FR3018385.

The compression methods in this patent allow for further compression of audio frames using a global codebook, with the same codebook used on the transmitter and receiver sides.

Two databases are generated with position vectors (frequencies) and magnitude vectors, using a partitioning algorithm.

Only the largest local peaks are used and phases are ignored. Any frame is represented by two numbers pointing to the nearest position vector and the nearest magnitude vector.

The bases can be generated with vectors of 16 to 32 elements, and a search can be made with only the first elements, for example the first four to eight elements.

Note that the codebook can be used only on the receiver side (unilateral codebook). The transmitter sends a vector of magnitudes and a vector of positions, or only reduced vectors. The receiver finds the right codes and then the right vectors. With the unilateral version, the receiver can modify its codebook at any time while being compatible with the transmitter.

If we take a number of first elements which allows us to generate a codebook of reasonable size and which allows us to have all the possibilities (for example with the first four elements, the relative positions on four bits, there are 65536 possible combinations), we can have direct access to richer vectors (for example to the vectors of positions). By establishing a correspondence with codes, symbols or words, one can significantly increase the transmission rates of pure data.

It should also be noted that these codes or vectors can be used as simple signatures to richer, and therefore higher quality, frames or even to the original frames used to generate the databases.

The patent application was filed on Mar. 29, 2016, filing number: FR1600516, publication number: FR3049799.

It concerns the compression of images and videos, particularly medical images (conventional radiography, CT or X-ray scans, magnetic resonance imaging or MRI, etc.), line by line, using FFT and the two planes mentioned above. The algorithms are still applicable but the phases are no longer secondary as in audio. The phases contain for example the details (images) or the rigid displacements (video). We can also compress k-spaces of dimension greater than 2 (3D, 4D, . . . ): these compression methods are one-dimensional (1D), but can be applied to the lines of k-space with dimensions greater than two.

As these compression methods are one-dimensional, to reduce the calculations, they can be applied to the rows or columns of an intermediate space obtained by applying a FFT on one dimension, for example on each row. In 2D for example, the second FFT to be applied to each column to have the components of the k-space is not applied.

Most of the vital signs are quasi-stationary signals, consisting mainly of local peaks in the frequency domain (heart pulses, lung pulses, . . . ). Vital signs can be compressed by our codecs and can benefit from the compression methods described in this paper.

We can mention as vital signs: the ElectroCardioGram (ECG), the ElectroMyoGram (EMG), the Arterial Blood Pressure (ABP), the PhotoPlethysmoGram (PPG). The ElectroencephaloGram (EEG) is more complex and must be taken into account by the largest points and the most energetic bands.

In order to be able to store the displacements in the associated phases, if the phases (in the FFT sense) are already used, after the selection of the local points or peaks, the sine amplitudes and cosine amplitudes are used. The amplitudes behave like magnitudes with sign. Knowledge of the two amplitudes allows us to determine the phase.

Variations of the two amplitudes in the same proportions have no influence on the phases. The magnitudes and amplitudes can undergo large (logarithmic) variations without significant consequences on the quality.

Both analog and digital modulations are affected. If they are applicable, with our processes and methods, the analog modulations allow to have the best performances from the point of view of the consumption and the rate of information to be transmitted.

In order to understand our approach and our work, we will begin by briefly recalling some generalities useful for the following. Most of the general information in this document is taken from the online encyclopedia Wikipedia.

A modem is a device that transforms a digital signal (sequence of bits) into an analog signal with properties that facilitate its transmission on a given channel. The transmission is generally carried out by modulating a sinusoidal carrier, whose amplitude, phase or frequency is modified at the rate of the signal to be sent. On the other side of the transmission chain, the receiving modem detects the modifications made to the carrier, and deduces the modulating signal.

If the signal to be transmitted is analog, we speak of amplitude, frequency or phase modulation; if it is digital, we speak rather of modulation by switching or jumping amplitude, frequency or phase because the modifications of amplitude, frequency or phase are brutal and discrete.

An analog signal is a continuous signal which can take an infinite number of values, whereas the digital signal is a discrete (discontinuous) signal, which is summarized in a succession of "0" and "1".

Analog Modulations:
AM, Amplitude Modulation.
FM, Frequency Modulation.
PM, Phase Modulation.

Many complex schemes combining analog modulations have been developed for specific needs.

Thus, the analog modulation of two carriers in quadrature is used for the transmission of color components on the subcarrier of the PAL system, or simultaneous phase and amplitude modulation in the NTSC system.

The amplitude modulation index is the measure of the change in amplitude relative to the amplitude of the unmodulated carrier. The amplitude modulation index is normally between 0 and 1 (between 0% and 100%) to avoid overmodulation. The transmission systems generally incorporate a limiter circuit to avoid such an overrun.

Digital modulations:
ASK, Amplitude-Shift Keying, modulation by amplitude switching.
FSK, Frequency-Shift Keying, modulation by frequency switching.
PSK, Phase-Shift Keying, modulation by phase switching.

The most commonly used forms of PSK are BPSK (or 2-PSK: two possible phase values), QPSK (or 4-PSK: four possible phase values) and DPSK (or differential-PSK: the information is contained not in an absolute phase value, but in the phase shift between two successive signals).

In digital modulation, the parameters of the carrier, amplitude or angle (argument), are switched between several discrete values according to the binary codes to transmit.

In APK (Amplitude-Phase Keying, or QAM, Quadrature Amplitude Modulation), the phase and the amplitude take different discrete values.

AFSK (or Audio FSK) is a variant of FSK in which the carrier is an audible signal, therefore with a frequency lower than a few kilohertz. In this way, the modulated signal can be transmitted by an installation designed to carry voice or music, for example a telephone or radio link. In the latter case, the signal is modulated a second time during transmission.

This is one of the techniques used in underwater acoustic communication and also a type of modulation used by radio amateurs for the 'packet radio' and the APRS (Automatic Packet Reporting System).

Although in decline, analog modulations (amplitude modulation, frequency modulation or phase modulation) can be used advantageously by our procedures and methods. We give here some additional useful details about these modulations for the quick understanding of the paper.

In analog modulation, modulation is applied to the carrier or subcarriers in proportion to the signal to be transmitted, by modifying the amplitude or the argument of the sine wave. There are several variants including two-sideband amplitude modulation, and single-sideband amplitude modulation. The two-sideband amplitude modulation is derived directly from the multiplication of the carrier wave by the signal. It is used in broadcasting (GO, PO and OC).

Frequency modulation is a modulation mode consisting of transmitting a signal by modulating the frequency of a carrier signal. Frequency modulation (FM) makes it possible to restore the continuous component of the signal, it is used in high-fidelity broadcasting ("FM" band), in satellite television broadcasting, and in analog image transmission (radio facsimile, Slow Scan Television or SSTV).

Phase modulation (PM) is used in VHF and UHF radiotelephony. Since phase modulation preceded by filtering is equivalent to frequency modulation, it is also another way of frequency modulating in radiotelephony.

Analog versions of QAM (Quadrature Amplitude Modulation) are typically used to allow two analog signals to be modulated on a single carrier. For example, it is used in PAL and NTSC television systems, where the different channels provided by QAM allow it to carry chrominance (color) components. In radio applications a system known as C-QUAM (Compatible QUadrature Amplitude Modulation) is used for AM stereo radio.

In digital, QAM (Quadrature Amplitude Modulation) is a technique that employs a combination of phase and amplitude modulation (by switching). It is widely used by modems to enable them to offer high bit rates.

In a QAM constellation, the distance of the point from the origin indicates the amplitude, its angle indicates the phase shift. Each of the channels defined by DMT (Digital Multi Tone) multiplexing in ADSL (Asymmetric Digital Subscriber Line) is modulated in QAM on a maximum of 15 bits. 32768 combinations of amplitudes and phase shifts are therefore used.

Pulse Code Modulation (PCM) requires a step size (which may not be linear over the entire range) and encodes it as a digital value (which will have a certain number of bits per sample); this will always introduce quantization noise.

PCM is a digital representation of an electrical signal resulting from a digitization process. The signal is first sampled, then each sample is quantized independently of the other samples, and each of the quantized values is converted into a digital code. The independent processing of each sample means that there is no encryption or data compression.

In audio, our processes and methods receive PCM data as input.

PAM (Pulse Amplitude Modulation) coding uses the physical amplitude of the sample as the final modulation. It is an analog modulation technique (the amplitude used for modulation is the actual sampled value, not the closest approximation used in PCM, although it can be bounded).

The number of possible pulse amplitudes in analog PAM is theoretically infinite. Digital PAM reduces the number of pulse amplitudes to a power of two.

Some versions of the Ethernet communication standard are an example of the use of PAM (100 BASE-T, 100 BASE-T4, . . . ). Pulse amplitude modulation has also been developed for the control of light-emitting diodes (LEDs), particularly for lighting applications. PAM coding is a technique that is also used in PCM.

The main transmission channels are: wireless channels, wire channels and optical channels.

Our procedures and methods are very general and apply to all these communication channels. They can also be applied to underwater communications. They can use a dedicated network or an existing network. They can even use one or more channels of an existing network. We also give some generalities to better understand our approach.

The traditional telephone network or PSTN (Public Switched Telephone Network) uses a pair of copper wires.

A PCM (Pulse Code Modulation) frame is a 2.048 Mbits/s frame comprising 32 time slots (TS), 30 of which are intended for users (TS 0 and 16 are reserved for the service). Each IT time slot receives the equivalent of a sample of digitized sound, or 8 bits.

The entire frame can therefore contain 256 bits. The PCM frame was developed for the time switching of digitized telephone channels. It allows 30 digitized telephone channels to be multiplexed on the same pair.

Subsequently, the 30 digital channels of the PCM frame were used to transmit all kinds of digital data (FAX, X25 data, video, etc.). The PCM frame allows the transmission of 30 digital channels, the signaling for the 30 channels and the synchronization of all the information.

The bandwidth required to transmit the human voice so that it can be correctly understood is: 300-3400 Hz. Sampling is, after filtering, an operation carried out on the signal to be transmitted in order to carry out the Analog/Digital conversion. It consists in substituting, with the original signal, a series of instantaneous values taken on the signal and regularly spaced in time. At precise moments, regularly spaced, one takes a sample of the signal, which will be representative of the amplitude of this one. On reception, to recover the original signal, the samples are filtered by a "low-pass" filter at 4000 Hz.

Shannon's theorem shows that the original signal cannot be reconstituted correctly if the sampling frequency is not greater than twice the upper frequency of the signal to be transmitted. For the PCM frame the sampling frequency is 8000 Hz.

Bit rate of a voice, quantized on 8 bits, i.e. 256 levels: 8000×8 64 Kbps.

Frame duration: 1000000/8000=125 microseconds.

Almost all metropolitan, regional, long distance and submarine networks today are based on fiber, which means that they can already scale to meet the voracious growth of data center interconnections by taking advantage of the latest optical transmission technologies.

Optical fiber has become the primary medium for high-speed transmission. Modulation techniques consist of converting electrical signals into optical signals.

However, two main techniques are possible: direct modulation and external modulation.

The first one is simple but unsuitable for high data rate and long transmission distances. Then the external modulator is the solution to this constraint.

Amplitude switching modulation is applied by varying the amplitude of the signal according to the bits to be coded. Analog amplitude modulation is applicable. It should be noted that amplitude modulation is the only one that can be used on optical fibers, because the equipment currently in use is not able to apply any other modulation to light waves. On the other hand, this modulation is rarely used on other media, because it causes a deterioration in the signal-to-noise ratio.

Direct modulation: the principle of direct modulation is trivial: in digital modulation, to transmit a "1", the laser diode is turned on and for a "0" it is turned off. This type of modulation is only used for data rates lower than about 5 Gb/s, beyond which it is no longer possible to modulate the laser diode directly, and an external modulator must be used.

External modulation: For data rates above approximately 5 Gb/s, direct modulation of the laser is no longer possible. The laser diode works in continuous mode and an external device is used in front of it which allows the light to be interrupted or passed through depending on whether a "1" or a "0" is to be transmitted (in digital modulation).

The methods described herein can be used with laser diodes in continuous or non-continuous mode, in direct or external modulation, in digital or analog modulation. In the case of continuous mode operation with an external device, the use of analog modulation can be considered.

Amplitude modulation is found with LED (Light-Emitting Diode) bulbs, which allow information to be transmitted at very high rates.

A light-emitting diode, abbreviated as LED, is an optoelectronic component capable of emitting light when an electric current flows through it.

LED bulbs are starting to replace traditional bulbs: they are much less energy consuming, less hot and more colorful, and have many advantages. The main problem with an incandescent lamp is that most of the energy is lost as heat. With LEDs, it's different. The radiation emitted is no longer produced by the temperature but by the material itself.

Li-Fi or Light Fidelity is a wireless communication technology based on the use of light with a wavelength between 480 nm—or 670 THz—(blue) and 650 nm—or 460 THz—(red). While Wi-Fi uses a radio part of the electromagnetic spectrum outside the visible spectrum, Li-Fi uses the visible (optical) part of the electromagnetic spectrum. The principle of Li-Fi is based on the coding and sending of data via the amplitude modulation of light sources (scintillation imperceptible to the eye), according to a well defined and standardized protocol.

Li-Fi differs from laser, optical fiber and IrDa (infrared) communication by its protocol layers. The protocol layers of Li-Fi are suitable for wireless communication up to about 10 meters, slightly more than low-power Bluetooth, and less than high-power Bluetooth or Wi-Fi.

Solar Li-Fi will use a solar cell instead of the photodiode classically used in Li-Fi technology. This technology will take advantage of the wide availability of solar cells in IoT products, such as cars and street lights. A new innovative wireless communication device that uses solar cells not only to power itself, but also as a receiver of light-transmitted data, could herald a revolution in the quest for Internet access in remote areas.

The major drawback of Li-Fi at present is that it is unidirectional: while it can send information to a user, it cannot receive it, unlike Wifi.

Our processes and methods are compatible with transmissions by Li-Fi or by solar Li-Fi.

Of course, the data of the codecs of this document can be transported or stored with existing general processes and methods.

The objective is to be able to transport or store the data of these codecs in other ways, with or without additional data, using existing infrastructures or creating new infrastructures. For transport, these processes are optimized for the Internet of Things (IoT), targeting long transmission distances.

In the field of IoT, there are currently two types of networks: the Sigfox network and the LoRaWAN network. These two networks are also called LPWAN (Low Power Wide Area Network) networks.

UNB (Ultra Narrow Bandwidth) networks use very narrow bandwidths (generally less than 1 kHz) to reach very long communication distances (for example 5 km in the city and more than 25 km in the countryside). By using very low data rates, very little power consumption is required to transmit over long distances.

Sigfox is an example of a UNB network. The protocol allows equipment to send only 140 messages per day. This technology has a very long range (over 40 km) and the consumption of a chip is 1000 times lower than that of a GSM chip. Sigfox objects therefore have a lifespan that can exceed 10 years of autonomy.

On the other hand, the defect is that it has little flow, it allows to pass a few kilobytes. Specifically, an object equipped with a Sigfox chip can transmit 140 messages, each of 12 bytes per day. During communications, the bit rate is 100 bps in Europe and 600 bps in the United States. In reception, the bit rate is 600 bps.

The LoRaWAN protocol is a communication protocol for the Internet of Things that uses a proprietary CSS (Chirp Spread Spectrum) modulation technique called LoRa. This protocol is intended to be simple, inexpensive to implement, and energy efficient rather than enabling high data rates.

The target of LoRaWAN is clearly long-range communications at low cost and low power.

With the processes in this paper, the use of phases allows for very narrow bandwidths. The use of analog or digital modulations block by block (taking into account a whole frame) makes it possible to have very low rates in communication, thus making it possible to have very low consumptions. We describe below the processes used to reduce bandwidths, and to reduce consumption.

Local peaks without phase:

The selected local peaks are moved closer together so that they are contiguous. The displacement of each local peak is stored in the associated phase. A number of pairs of values (magnitudes, phases) are obtained and transformed into sine and cosine amplitudes. In order to reduce the bandwidths, we synthesize a new signal, low frequency, time domain using an inverse FFT. This signal, of low frequency and reduced bandwidth can be sent in several ways, for example:

Directly, after a DAC (Digital to Analog Converter) conversion.
After a DAC conversion and with analog modulation.
With digital modulation.

A suitable sampling frequency and number of bits per sample are chosen.

For example, if we choose between 12 and 16 local peaks for a complete frame, we will have between 24 and 32 values to find. If we transmit 32 frames per second, in analog, we only transmit 32 frames per second. If we transmit 32 frames per second, in digital, we can transmit between 32×24=768 samples and 32×32=1024 samples per second. You can choose between 8 and 16 bits per sample.

At the receiving end, the reverse operations are performed: ADC (Analog to Digital Converter) if a DAC was used, FFT, recovery of the amplitudes, then recovery of the magnitudes and phases, finally positioning of the local peaks in their place.

Generating a very narrow bandwidth signal with the local points and peaks ignoring the phases comprises associating new phases to the points, comprises grouping the points so as to have a very narrow bandwidth, comprises putting the displacements or the original positions of the points in the associated phases, and comprises synthesizing a new, relatively low-frequency, time-domain signal using an inverse FFT.

Points with phases, local peaks with phases:

In order to take into account the real phases in the FFT sense of the points and local peaks, the magnitudes and phases are transformed into sine and cosine amplitudes; these amplitudes, which will be used to recover the phases, can be considered as magnitudes with sign and are used to generate two separate low frequency signals, each signal can be considered as a signal without phase. The previous procedure is applied to each signal.

If the communication media allow, analog QAM modulation can be used to transmit both signals at the same time.

Taking into account the actual phases in the FFT sense of the local points and peaks, comprises transforming the magnitudes and phases into sine amplitudes and cosine amplitudes, comprises considering these amplitudes as magnitudes with sign, comprises generating two separate low-frequency signals, each signal being considered as a signal without phase, and transmitting these signals, and comprises recovering the FFT phases from the received amplitudes.

Background Bands:

With the background bands, with or without the phase sign, there is only one low frequency signal to be generated per band; there are no displacements of the points even though there are some null points due in particular to the absence of the foreground points; the data are carried directly in the phases associated with the points. The bands are transmitted one after the other, after FFT inversion.

Transporting the foreground data and additional pure data in the background bands comprises leaving the points at their place, even if there are some null points due in particular to the absence of the points of the foreground, comprises ignoring the phases in the FFT sense or taking only the sign of the phases in the bands, and comprises transporting the data directly into the reintroduced phases associated with the points.

In order to increase the data transmission capacity, the zero points in the background corresponding to the points of the foreground can be replaced by points of any magnitude, in particular random, but less than the smallest of the magnitudes of the points in the foreground. During the decompression, these points can be recognized and ignored for the media because they correspond to non-zero points in the foreground.

We describe the principle of power reduction below.

The electrical energy required to provide a pulse is equal to the pulse energy divided by the pulse length.

By lengthening the transmission times, the electrical power required is reduced.

This is possible with low frequency frame transmissions. Analog modulations, if they can be used, provide the best performance.

There are two main types of modulation in LPWAN:

Modulation with ultra-narrow band, which consists of transmitting signals in the narrowest possible frequency band (Sigfox network for example).

Modulation with a spread spectrum, which consists of spreading the spectrum over a large frequency band with very low transmission power (LoRaWAN network for example).

Frequency-Hopping Spread Spectrum (FHSS) is a technique for transmitting signals by radio waves that alternately uses several channels (subcarriers) distributed in a frequency band according to a pseudo-random sequence known by the transmitter and receiver.

Direct-Sequence Spread Spectrum (DSSS) is a technique used in satellite communications, wireless networks and more specifically the version of Wi-Fi defined by the IEEE 802.11b standard.

The purpose of DSSS is, on the one hand, to make signals occupying a frequency band, such as a speech signal, more resistant to jamming and interference encountered during transmission, and on the other hand to allow several devices to share the same carrier frequency (code division multiple access).

The processes of this document are compatible with frequency hopping spread spectrum, by varying the starting frequency of the low frequency signal, and direct sequence spread spectrum, by using the background bands simultaneously, with possible spacings between the bands.

Using the frequency hopping spread spectrum comprises varying the starting frequency of the low frequency signal, and using the direct sequence spread spectrum comprises using all the background bands simultaneously, with possible spacings between the bands.

Our processes are designed for multimedia or vital sign data. Although our processes can make do with a small bandwidth, with these types of data, the frame rates per day are much higher than networks like Sigfox.

For example, it is possible to go from 8000 samples per second to 32 frames per second in analog modulation and 768 samples per second in digital modulation, on a pair of copper wires. In simple transfer of information or multimedia messages, it is possible to chain the transmissions of the frames as well as possible.

Our processes can concern sensor data and allow data rates similar to those of networks like Sigfox. It is necessary to provide a regular record of the data or to make interpolations to have regularly spaced data. We then apply the compression methods in this paper (FFT, foreground and background), and then store the service data in the background phases before transmissions. For example, if we have sensor data every two, five, or ten seconds, after ten minutes we will have FFT buffers of 300, 120, or 60 points.

It is possible to reserve the entire background (magnitudes and phases) for pure data transport and the foreground for multimedia data transport. Similarly, between two multimedia frames, the entire foreground and the entire background can be used to transport pure data.

It is possible to use some of our techniques (inverse FFTs and intermediate FFTs to reduce bandwidths and bandwidth requirements) with other transformations that do not use phase, such as DCT (Discrete Cosine Transform), MDCT (Modified Discrete Cosine Transform), or real DWT (Discrete Wavelet Transform).

Creating and transmitting UNB frames and moving back to the starting domain comprises using transforms as DCT (Discrete Cosine Transform), MDCT (Modified Discrete Cosine Transform), and real DWT (Discrete Wavelet Transform).

High-speed communications are supported by our processes. Techniques similar to those used with OFDM (Orthogonal Frequency-Division Multiplexing) are used.

OFDM is a method of coding digital signals by orthogonal frequency division in the form of multiple subcarriers. Since OFDM is a block transmission system, a guard interval is generally introduced between the blocks. This eliminates interference between successive blocks in the presence of multipath channels. If the subchannels have a sufficiently narrow frequency band, they are frequency non-selective.

The following techniques or protocols use OFDM:
IEEE 802.11 a and g (WLAN).
IEEE 802.16a (WiMAX).
ADSL (Asymmetric Digital Subscriber Line).
DAB (Digital Audio Broadcasting).
DVB-T (Digital Video Broadcasting).

The new generation mobile networks (LTE, 4G) use a variant called OFDMA (Orthogonal Frequency-Division Multiple Access). OFDMA is a data multiplexing and coding technique used mainly in 4th generation mobile telephone networks. This radio coding combines frequency and time multiplexing, i.e. "frequency division multiple access" (FDMA) and "time division multiple access" (TDMA). It is used in particular in 4G LTE, LTE Advanced and Mobile WiMAX (IEEE 802.16e) cell phone networks.

Below is an example of data from an OFDM network at 54 Mbits per second (WLAN):
Symbol duration: 4 microseconds.
Number of data subcarriers: 48
Number of bits per subcarrier: 6 (64-QAM)
Number of bits per symbol OFDM: 6×48=288
Number of bits per symbol: (¾)×288=216 bits
Bit rate=216/4 microseconds=54 Mbps The symbol duration of 4 microseconds is composed of a frame transmission time (TFFT=3.2 microseconds) and a frame separation time (TG=0.8 microseconds).

For WiMAX, the TG/TFFT ratio can be ¼, ⅛, 1/16 or 1/32.

With OFDM, in high speed, we fight against frequency selective channels (multipath) by extending the transmission time: delays become negligible.

With our processes, it is possible to take advantage of these transmission times to transmit an entire frame in the time domain in modulation, especially analog.

The bands with very homogeneous frequencies are naturally ready for OFDM. The bands may concern the background only. The bands can also involve a mixture with points in the foreground, after selection of the points (in this case, no data is transported). Finally, it is possible to divide the foreground into bands made up of points with phase, to keep the background in bands made up of points without phase or with the sign of the phase (in this case, the background can transport data). The foreground and background bands do not contain the same frequencies. To match a band to an OFDM frequency or subcarrier, a global (uniform) shift of frequencies from the band to the frequency or subcarrier is performed. The frequency of the center of a band can be chosen as the frequency of the subcarrier, if we take a contiguous zone of bands.

Note that if no data is carried, the quality of the background can be improved by adding a phase to the points. There is no additional cost for transmissions compared to data transport or if analog QAM is used.

Note also that the magnitudes and amplitudes can be logarithmic, with no noticeable effect on quality. If the sine amplitudes and cosine amplitudes undergo the same distortions, there is no effect on the phases. The crest factor can be reduced significantly.

As in OFDM, Orthogonal Frequency-Division Multiple Access, the bands are divided between several frequencies or several subcarriers, a single inverse FFT is used, and a single signal is transmitted for the entire frame.

Transmitting the entire frame with background bands comprises distributing the bins of the bands between several frequencies or several subcarriers, as in OFDM (Orthogonal Frequency-Division Multiplexing), and making a single inverse FFT.

An ADSL link uses the PSTN but uses several frequencies at the same time called subcarriers. ADSL uses the concept of subcarriers.

ADSL uses a frequency band between 0 Hz and about 1.1 MHz, divided into 255 intervals of 4.3125 kHz. ADSL 2+ uses a frequency band from 0 Hz to about 2.2 MHz, divided into 511 4.3125 kHz intervals. VDSL uses up to 30 Mhz (30a) and is normalized to 17 MHz (17a). The guardband between 2 subchannels is 300 Hz.

Our processes are compatible with ADSL links.

With protocols such as uXDT (Ultrasonic Cross-Device-Tracking), it is possible to take advantage of a television broadcast to send non-audio messages (uBeacons) to mobiles located next to the television via ultrasound.

With our methods, the transmission rates can be increased considerably with uXDT, if one wants to transmit in the 18-20 kHz range at all costs in order to use the existing hardware. It is even possible to transmit voice, image or video on one or more frequencies or several subcarriers.

One of the main techniques for the future 5G cell phone standard is based on F-OFDM (Filtered-OFDM). The subcarriers are grouped into subgroups which are modulated and synchronized independently. An inverse FFT is performed on each subgroup. The resulting time-domain signals are added together to form the final signal to be transmitted.

With the processes of this document, techniques similar to F-OFDM, Filtered-OFDM, are used, especially in multiplexing several sources or several types of media.

VHS (Video Home System) refers to a standard for recording video signals on magnetic tape developed in the late 1970s. VHS began to decline in the early 2000s. The gradual cessation of analog television broadcasts in favor of DTT (Digital Terrestrial Television) in many countries precipitates its disappearance. On a VHS tape, signals are recorded using frequency modulation, a waveform. Everything is analog in VHS.

The LaserDisc was the first optical storage medium (initially for video) to be commercialized. Although it offered good sound and image quality, the LaserDisc had little success. Nevertheless, it is from the LaserDisc technology that several optical storage media have been developed, notably CDs and DVDs, which have enjoyed considerable success. LaserDisc is an analog medium (for video). It uses frequency modulation with the help of pits engraved on the disc.

The methods of this document can also be applied to data storage, and both analog and digital modulations can be used.

Transmissions, including frame by frame, can be easily secured by scrambling displacements, magnitudes or amplitudes, and by scrambling the band order if they exist.

In order to scramble the data, it is sufficient to scramble the phases carrying the data, by scrambling the displacements. At low bit rates, to scramble a UNB frame, it is sufficient to scramble the phases that bring the points closer together. We can start by scrambling the order of the points or the local peaks. Strong interference is obtained by scrambling the magnitude or amplitude values. At high bit rates, to scramble a frame similar to an OFDM or F-OFDM frame, it is sufficient to scramble the band order in addition.

In low-speed decoding, with UNB frames, a minimal, simple and automatic means of verification is available: the phases (which represent the displacement of local points or peaks to form very narrow beams) must be increasing. If only local peaks are used, they must not be contiguous.

Although the accuracy of the magnitudes is less important than the accuracy of the positions (contained in the phases), the importance of the accuracy of the positions decreases as the values of the positions increase. There is some tolerance to distortion in time domain transmissions. Losses of multimedia frames may be tolerable. For pure data or if security is enabled, losses are not tolerable. Error detection and correction mechanisms must be implemented.

Points in a band can be reserved or points can be added to a band or a UNB frame to carry a checksum to recognize these bands or frames in the noise.

Retransmissions are possible and compatible with multimedia data transmissions. Between two multimedia frames, data frames can be inserted that can use all local points or peaks, as well as magnitudes and phases.

Note that the basic compression algorithms in this paper may require non-multimedia data. For example:

If not all bands in the background or a contiguous area of bands are used, the band number must be specified.

A simple k-number can be sent to indicate that the current frame is identical to the frame behind at position k.

In video, intermediate frames can be encoded by value difference and can use lossless compression.

The background does not contain any points of the foreground. In addition, decimations can be applied. For example, the simple decimation consists in taking a point on two, the larger of the two points, located on the left or on the right. From the simple decimation, the double decimation consists in taking the larger of the two points. More generally, the decimation of order D consists in taking a point on 2 to the power D.

It takes D bits to encode the local non-zero positions after decimation. We can perform a combination of several types of decimation: for example no decimation in the center (k-space) or on the left, then simple decimation, then double decimation, etc. The non-zero points after decimation are called non-decimable points.

We can also implement, for the coding of positions in the background, a decimation using several tracks and interlaced pulses. S, veral tracks are chosen for the whole background or for a part of the background, each track must contain one or few non-zero points, each position being found in one and only one track.

For example, if we choose five tracks of length 8, with only one possible bit per track, we need 3 bits per track to know the position of the non-decimable point.

Possible positions for the tracks:
Track 1: 1 6 11 16 21 26 31 36
Track 2: 2 7 12 17 22 27 32 37
Track 3: 3 8 13 18 23 28 33 38
Track 4: 4 9 14 19 24 29 34 39
Track 5: 5 10 15 20 25 30 35 40

Each non-zero bit corresponds to the point of greatest magnitude of the track.

In order to be able to use the phases in the FFT sense for certain points of the background to increase the quality, or in order to increase the quantity of pure data to be transported, we implement the virtual decimation in the background bands, which consists in using the decimable points to transport the data. The non-decimable points must contain the magnitudes and the possible phases of the codec, the phases and possibly the magnitudes of the decimable points must contain the pure data, furthermore the magnitudes of the decimable points must not be greater than those calculated.

Implementing the virtual decimation in the background bands comprises using the non-decimable points to contain the magnitudes and the possible phases of the codec, comprises using the phases and possibly the magnitudes of the decimable points to contain the data, and comprises ensuring that the magnitudes of the decimable points are not greater than those calculated.

The error correction and redundancy bits can be placed in the background phases or in the decimable points of the background.

The methods in this document can be applied to blockchain technologies. Blockchain technologies called blockchain are implemented, based on media, audio, image and video, the local points or peaks are not moved, and the background is used to store the data, which are the hashes from the mining algorithms. The foreground and background (without the phases) give a preview of a block in the chain. The original media itself is compressed with the codec of one's choice, for example in JPEG or PNG for images. The hashes are performed on the compressed documents with the codec of one's choice.

To ensure a true chain, the background is divided into two parts: one part contains the hashes of the documents compressed with the codec of one's choice, the other part contains the hashes of the previous complete block of the chain.

The original media must not change, but their locations may change. The addresses are put in the metadata associated with the blocks.

With blockchain technologies called blockchain, in order to minimize the computations, semi-decentralized techniques are implemented, the current block is divided into three parts: a left part which is issued from the validation of the previous block, a central part which contains the useful information, and a right part which will be issued from the validation of the current block. The person who validates the current block (the miner) has at his disposal the central sub-block compressed with the codecs of this document (sub-block A), the central sub-block compressed with the codec of his choice (sub-block B) and a key provided by the system. It performs, in a more or less automated way, the following operations:

It provides a media of the same type as the blockchain media.
It compresses a block composed of the left sub-block, the compatible media it has provided and the central sub-block, with the codec of its choice.
He encrypts the compressed data of this block with the key provided by the system.
He applies the hash algorithms on this new encrypted block.
It distributes the hash data in the background of sub-block A to have sub-block A1.
It performs an inverse FFT on the sub-block A1 to get the sub-block C.
The sub-block C, right part of the current block, will be the left part of the next block to be validated.

We use blocks based on audio, image or video, the three parts are of the same nature. If audio or video is used, a frame-by-frame correspondence is established between the parts and each frame is worked on as described above.

In order to take text documents into account, they must first be converted into images.

Our processes are compatible with those based on very heavy and dissuasive computations, totally decentralized. By giving a more important role to the central system, we obtain semi-decentralized processes. The calculations can then be made much lighter. The system cannot be attacked because, for each validated block, there is:
  the signature of the system in the form of a key, which signature can vary depending on the miner and the block;
  the signature of the miner in the form of provided media.
The effects of these signatures are propagated throughout the chain.

Several more advanced uses are possible with the processes of this document, in order to carry out transmissions over long distances.

A digital watermark is applied to UNB or Ultra Narrow Bandwidth frames in order to recognize them in the noise over very long distances. The very narrow bandwidths make them less sensitive to noise. This watermarking can be combined with spread spectrum techniques.

Instead of doing an inverse FFT and transporting the UNB (Ultra Narrow Bandwidth) frames via analog or digital modulations, we consider the magnitudes and the phases containing the displacements of the points as OFDM FFT bins, place them in OFDM subcarriers, use a known crest factor reduction technique, or simply optimize the phase oppositions, or duplicate the symbols on other subcarriers, with or without interlacing, and optimize the phase oppositions.

Transporting UNB (Ultra Narrow Bandwidth) frames as OFDM FFT bins, instead of with analog or digital modulations, comprises considering the magnitudes and the phases containing the displacements of the points as OFDM FFT bins, and placing them in OFDM subcarriers, and comprises using a known crest factor reduction technique, or simply optimizing the phase oppositions, or duplicating the symbols on other subcarriers, with or without interlacing, and optimizing the phase oppositions.

The foreground points are transported into the reintroduced background phases, with the foreground data including magnitudes, positions and phases, or sine and cosine amplitudes and positions. The sign of the phase from the compression can be retained, or the sign of the phase can be alternated or optimized.

Transporting the foreground points into the reintroduced background phases comprises the transport of the values of the magnitudes, positions and phases, or the values of the sine amplitudes, cosine amplitudes and positions.

One of the most important problems with OFDM transmissions is called the Peak-to-Average Power Ratio (PAPR). Current techniques for reducing the peak factor include Tone Reservation (TR) and Active Constellation Extension (ACE). By using our techniques, we can reduce the crest factor considerably. By alternating the sign of the phase in the background (plus sign for the first point, minus sign for the second, plus sign or the third, minus sign for the fourth, etc.), or by using a more sophisticated optimization, a large reduction in the crest factor is obtained.

In order to take into account cases where there are not enough non-zero bands in the background to carry the data, filler bands are inserted and this additional information (filler band or not) is also stored in the background phases.

In this advanced use case, instead of the zero points in the background, which correspond to the points in the foreground, we can put points or white noise of low magnitudes.

In the last advanced use presented in this paper, we will discuss additional processing methods applied to the output of a variable length encoding such as Huffman encoding, or run-length encoding (RLE), characterized in that a correspondence is established between the output of the variable length encoding or RLE encoding and the output of a FFT-based encoding, using a foreground composed of the largest points and a background composed of the most energetic bands. The goal is to use processes from this paper, including transporting the foreground points through the background bands for long distance transmissions.

Huffman coding is a lossless data compression algorithm that uses a variable length code to represent a source symbol. It is usually used in the second stage of compression, once the media-specific redundancy has been revealed by other algorithms (such as JPEG compression for images, MPEG for video and MP3 for audio). Lossless compression algorithms, such as those used for file compression, also use Huffman.

For example, LZH (Lha) and deflate (ZIP, gzip, PNG) combine a dictionary compression algorithm (LZ77) with entropy Huffman coding. With Huffman coding, the least frequent points use the most bits while the most frequent points use the least bits. With Huffman encoding, the less frequent points each using the most bits are mapped to the foreground points while the most frequent points each using the fewest bits are mapped to the background points.

The modeling of the output of the Huffman encoding as a FFT codec comprises matching the less frequent points each using the most bits to the foreground points, comprises matching the most frequent points each using the fewest bits to the background points, comprises matching the number of repetitions, up to a limit, to the phases with the foreground points, and comprises matching the number of repetitions, up to a limit, to the phases with the background points, or ignoring the repetitions in the background.

The RLE coding is very applicable to black and white scanned documents: instead of coding one bit per point, there is a counter indicating how many white or black points follow each other. RLE coding is also used for Group 3 and Group 4 faxes. The RLE coding is based on the repetition of consecutive elements. The basic principle consists in coding a first element giving the number of repetitions of a value and then completing it with the value to be repeated.

With the output of the variable-length encoding, the least frequent points are matched to the points in the foreground of the FFT encoding output, the number of successive repetitions up to a certain limit being contained in the phase, and the other points are matched to the background of the FFT encoding. We do not take into account the successive repetitions in the background. Finally, we alternate the signs of the phases in the background.

The least frequent points are chosen first and the maximum number of these points is chosen so that all the points in the foreground can be completely transported by the background. If the foreground points are transported into the background, on reception, the phases are first decoded to get the foreground, then the background points are found. If there are few non-zero points or if all the points are zero in the background, it may be preferable to use a reconciliation of the points and local peaks in order to have a UNB frame.

With the output of the RLE (Run-Length Encoding) encoding, the values to be repeated are matched to the magnitudes and the number of repetitions, up to a certain limit, to the phases. Either two UNB frames are transmitted, or the background is completely generated or completed and the foreground points are transported in the background bands.

The modeling of the output of the RLE encoding as a FFT codec comprises matching the values to be repeated to the magnitudes and matching the number of repetitions, up to a certain limit, to the phases.

FIGS. 1, 2, 3a, 3b, and 4 show an example of maximum reconciliation of the points (no zero FFT bin between points).

Figure 5A:
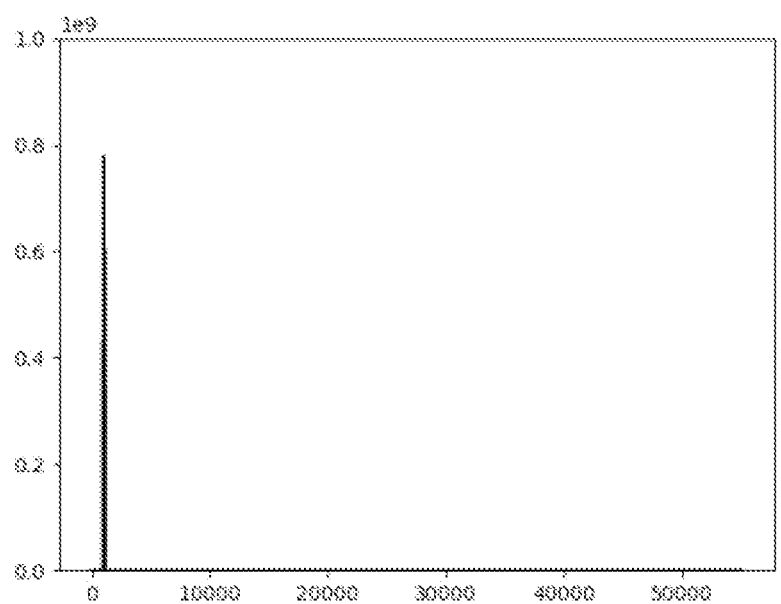
FIG. 5a: moderate reconciliation of the points, the phases containing the original positions of the points, in the frequency domain.
Figure 5B:
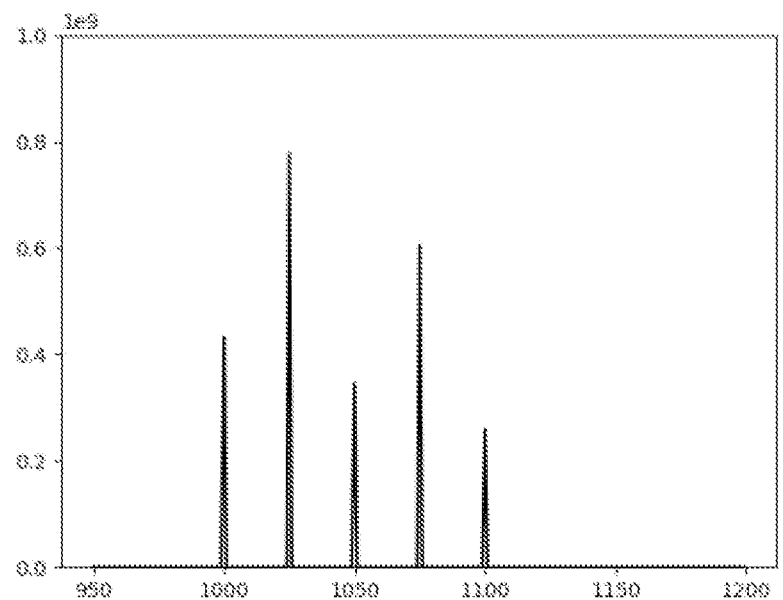
FIG. 5b: more detailed view in the frequency domain.
Figure 6:
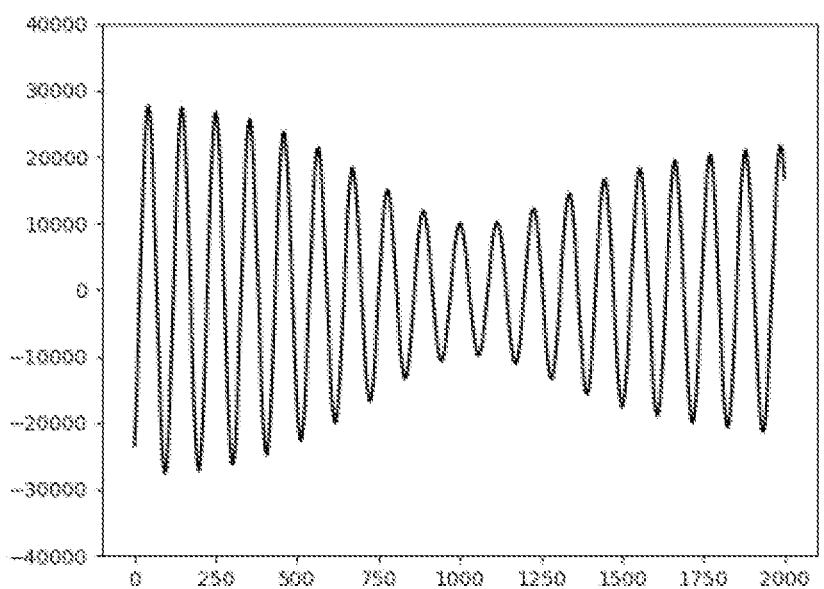
FIG. 6: resulting signal, in the time domain.
Figure 7:
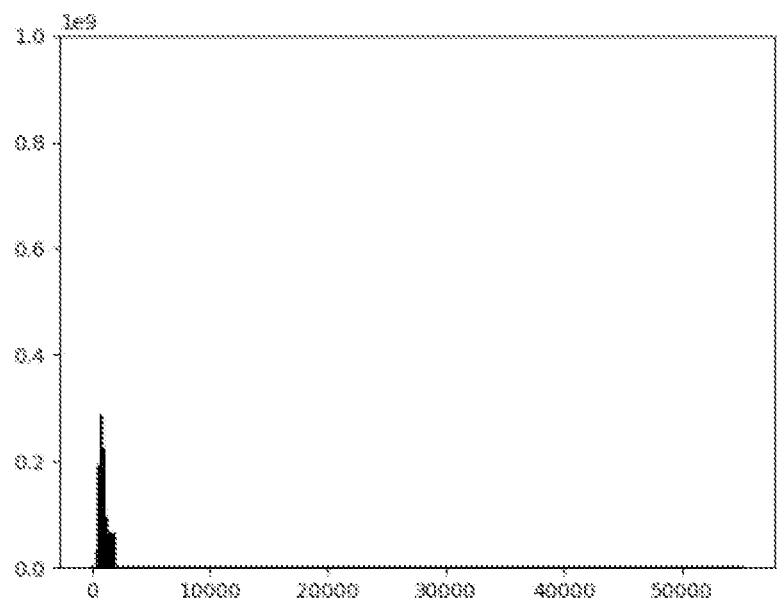
FIG. 7: normalized signal, composed of 29 points, in the frequency domain. We choose the 3 largest points for the foreground (phases: −pi/4, 0 and pi/4), and the rest of the points for the background (26 points, phases: 0).
Figure 8:
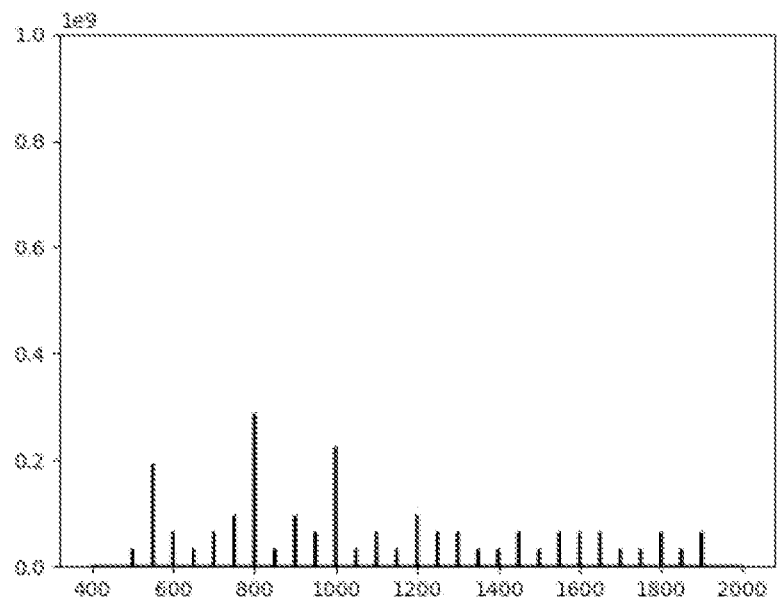
FIG. 8: more detailed view in the frequency domain.
Figure 9:
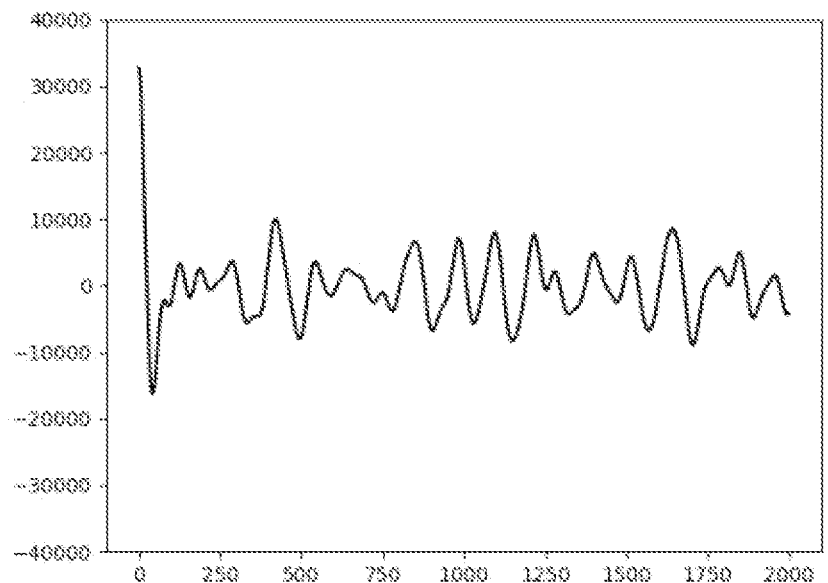
FIG. 9: resulting signal, in the time domain.
Figure 10:
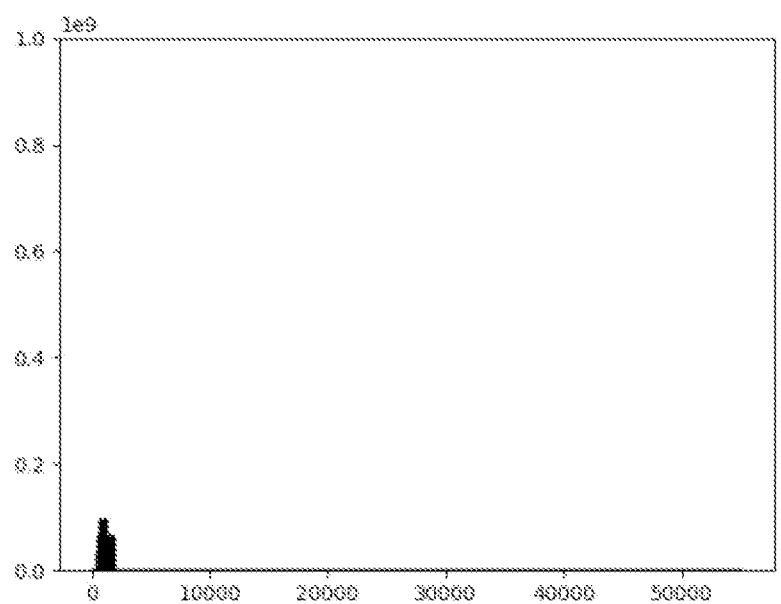
FIG. 10: the foreground is removed and the foreground points are transported into the reintroduced phases of the background, representation in the frequency domain.
Figure 11:
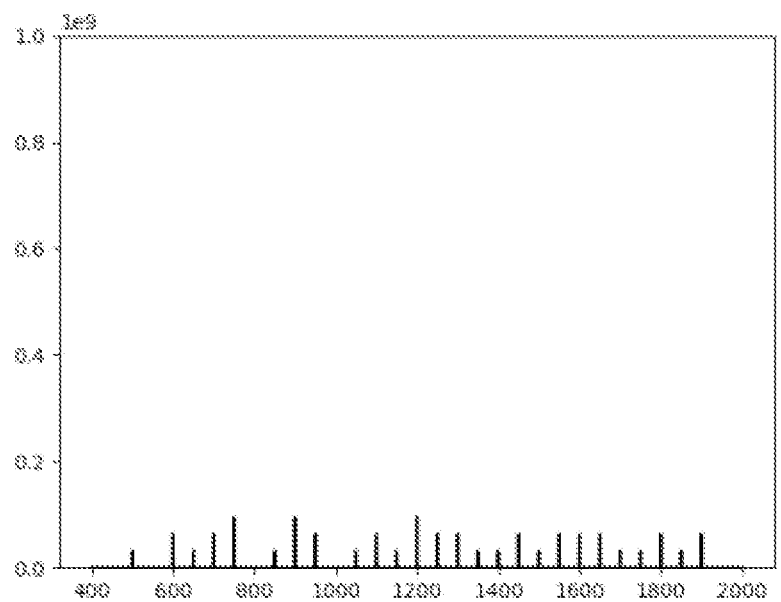
FIG. 11: more detailed view in the frequency domain.
Figure 12:
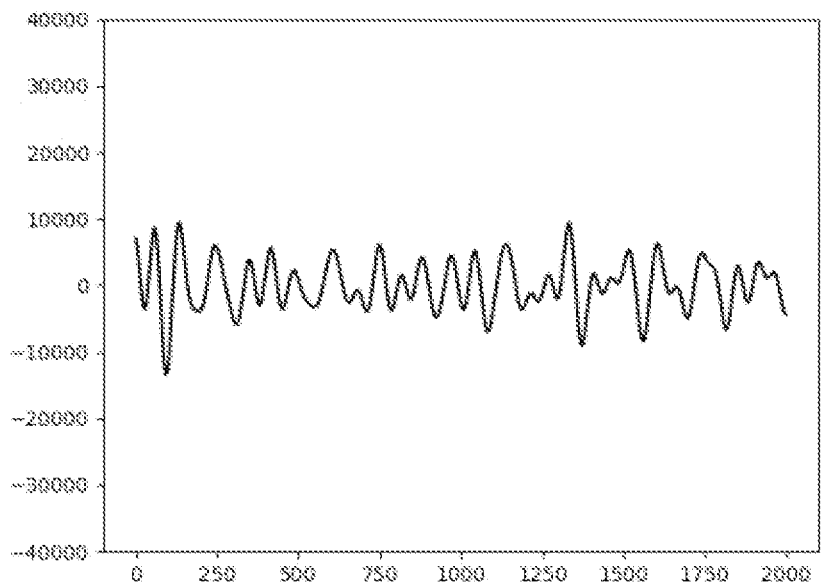
FIG. 12: resulting signal, in the time domain.

FIGS. 5a, 5b and 6 show an example of moderate reconciliation of the points (a few zero FFT bins between points).

The phases of the displaced points contain the original positions of the points, relative to the first point. We apply a simple rule of three to get the phases.

For example, if we count the displacements from the first point, the phase of the first point is zero, the other phases are calculated by the formula:

$$phase=-pi+2*pi*(n-n0)/(N/2-n0)$$

where n=position of the point, n0=position of the first point, N=number of points of the FFT buffer and pi=3.14159 . . . .

FIGS. 7, 8, 9, 10, 11 and 12 show an example of the transport of the foreground points into the background phases.

It is assumed that there are 29 points in all, the first 3 points of greatest magnitude forming the foreground, the other 26 points forming the background.

The initial phases of the background are zero, the phases of the foreground are: $-pi/4$, 0 and $pi/4$. Furthermore, the positions are assumed to be multiples of 10 bins.

We choose to transport each point of the foreground with 24 bits: 8 bits for the positions, 8 bits for the magnitudes and 8 bits for the phases.

The positions are encoded on 8 bits (values between 0 and 255).

The magnitudes are encoded on 8 bits using the logarithm. The magnitude codes are given by the formula:

$$code=CodeMaxi*log(Mag)/log(MagMaxi)$$

where CodeMaxi=maximum number depending on the number of coding bits (255 in our case), Mag=calculated magnitude, MagMaxi=maximum possible magnitude, depending on the number of points in the FFT buffer and the number of bits per point in the time domain.

If there are 16 bits per point in the time domain and N points in the FFT buffer, MagMaxi is calculated by the formula:

$$MagMaxi=32767*N$$

The phase codes on 8 bits, are obtained by applying a simple rule of three, by matching the values between $-pi$ and $pi$ to values between 0 and 255.

To transport the whole foreground, 3*24=72 bits are needed.

We choose for the phases of the background an 8-PSK modulation (Phase-Shift Keying), thus 3 bits per phase. The background can contain: 26*3=78 bits.

This is sufficient in this example, but if necessary we can add 3 points of small magnitude at the corresponding positions of the foreground points to increase the transport capacity.

We can also use relative positions or relative magnitudes (relative to the previous point) to decrease the number of bits per foreground point.

The codes of the positions to be transported are: 55, 80, 100, or in binary: 00110111, 01010000, 01100100.

The codes of the magnitudes to be transported are: 221, 226, 223, or in binary: 11011101, 11100010, 11011111.

The codes of the phases to be transported are: 97, 128, 160, or in binary: 01100001, 10000000, 10100000.

This corresponds to the following bits: 001 101 110 101 000 001 100 100 110 111 011 110 001 011 011 111 011 000 011 000 000 010 100 000.

The following correspondences between bits and phases are used:

"000": 0.0 , "001": pi/4 , "011": 2*pi/4 , "010": 3*pi/4 , "110": 4*pi/4 , "111": −3*pi/4 , "101": −2*pi/4 , "100": −pi/4

Figure 13A:
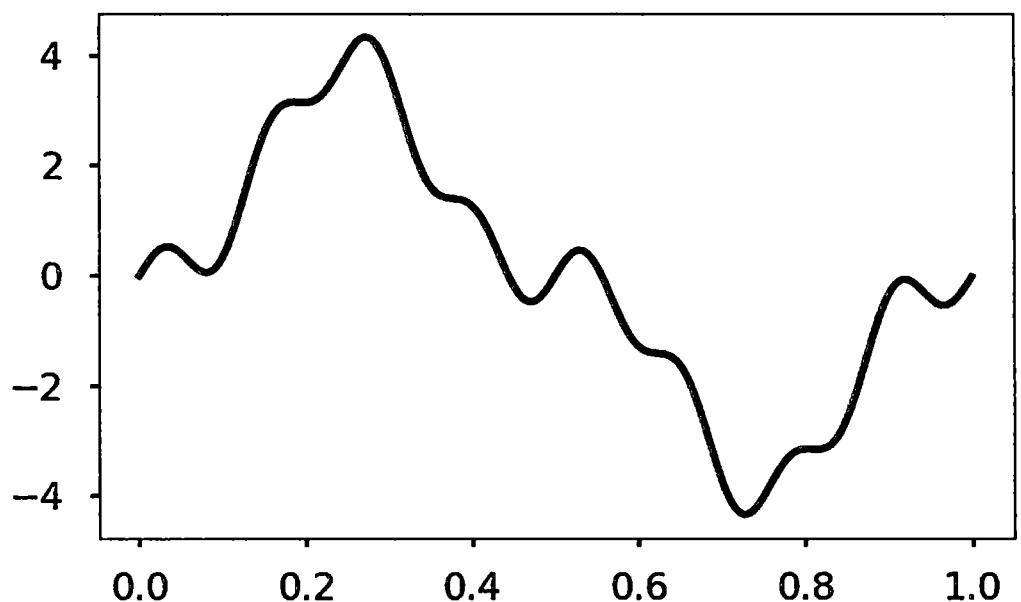
FIG. 13a: a signal in the time domain.
Figure 13B:
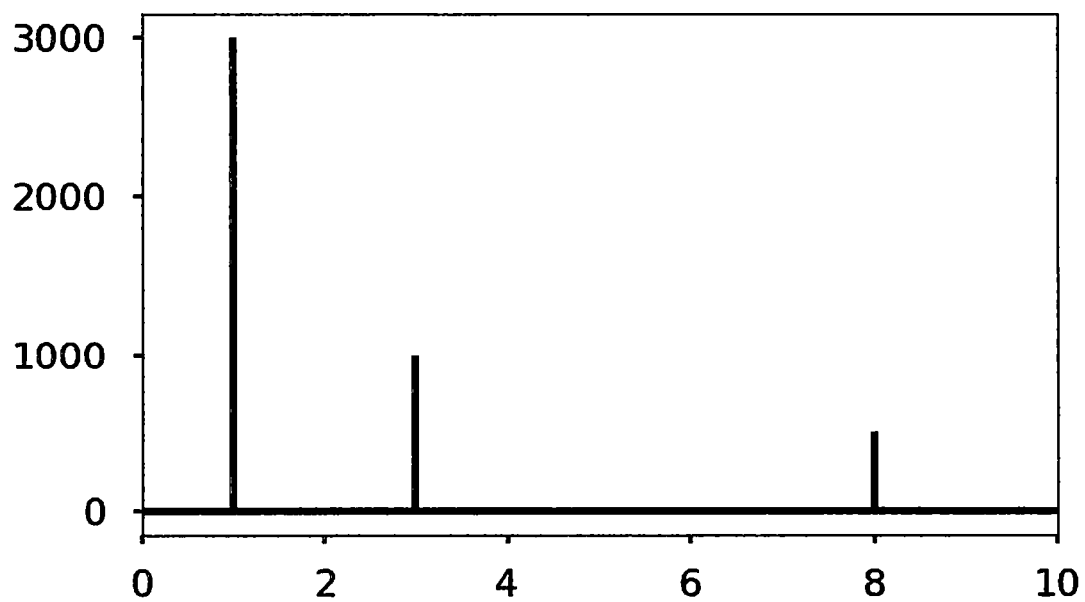
FIG. 13b: the magnitudes of the same signal in the frequency domain.
Figure 13C:
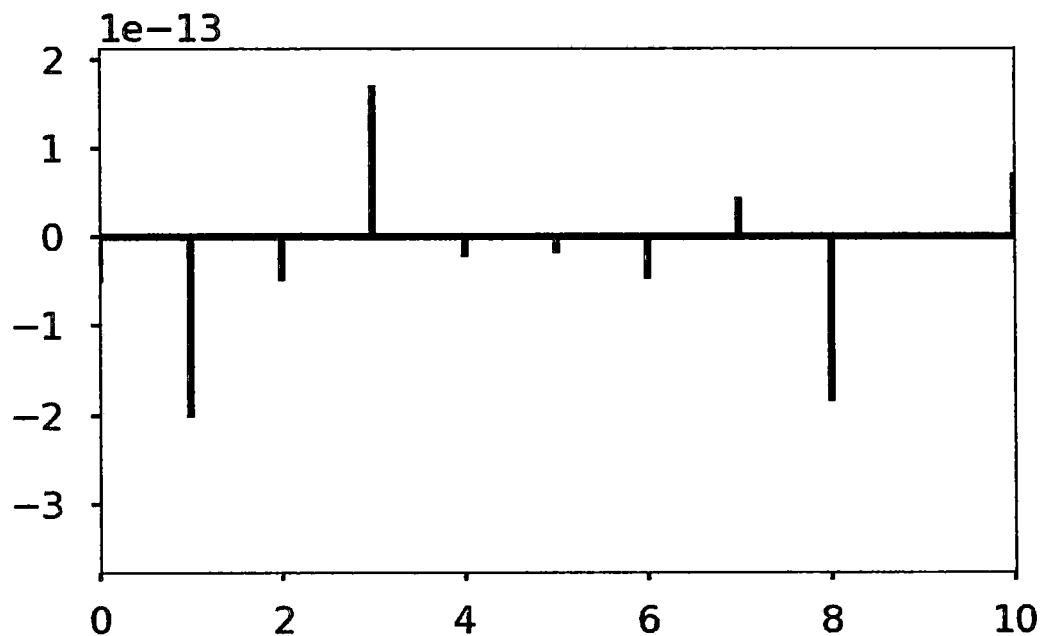
FIG. 13c: the real part (amplitudes of cosine waves).
Figure 13D:
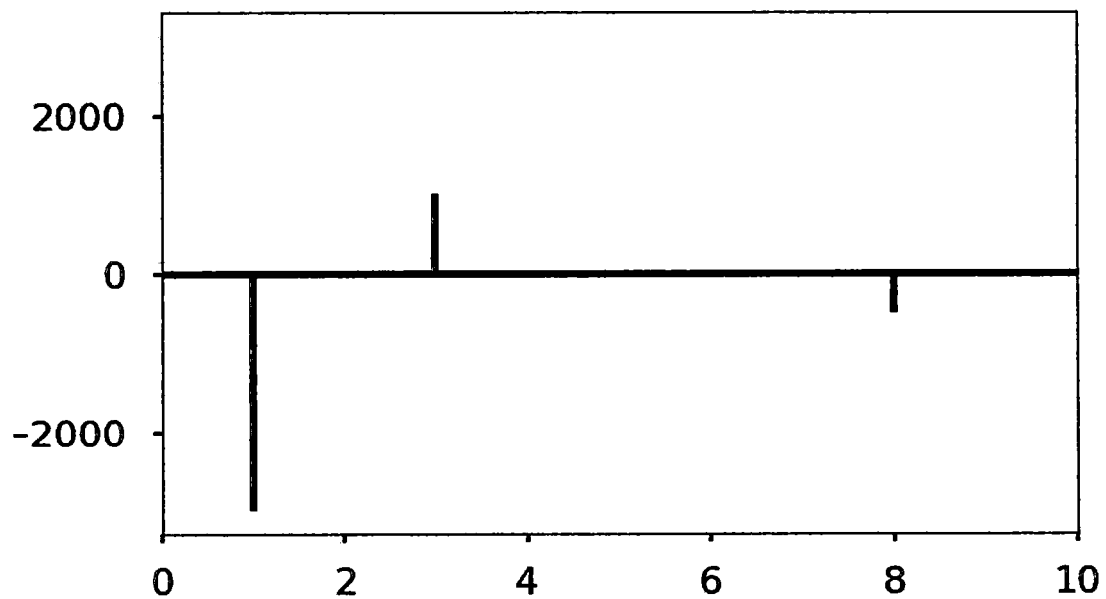
FIG. 13d: the imaginary part (amplitudes of sine waves).

The FIGS. 13b, 13c and 13d show that the amplitudes of the cosine waves and the amplitudes of the sine waves can be treated as signed magnitudes.

Figure 14A:
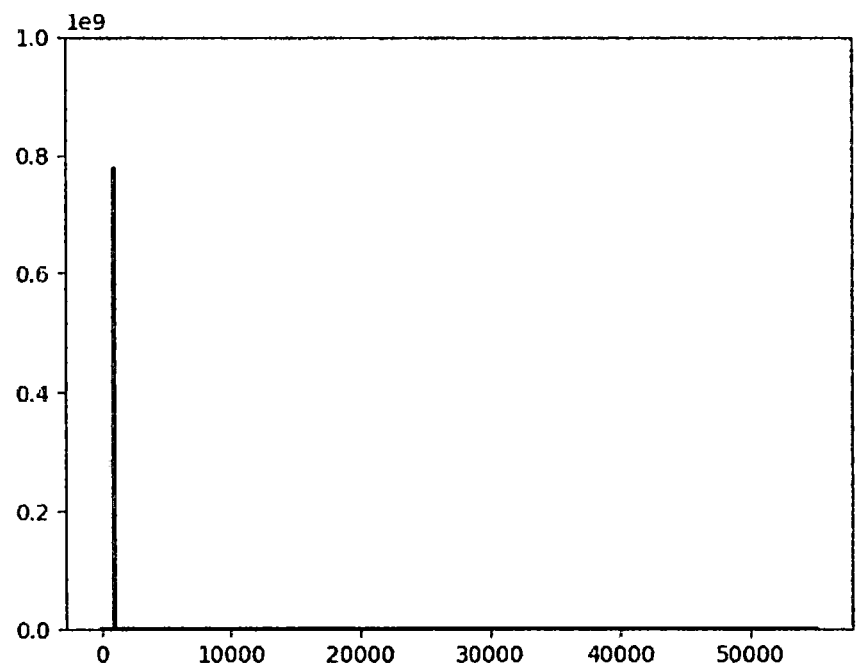
FIG. 14a: low frequency signal with an initial starting position.
Figure 14B:
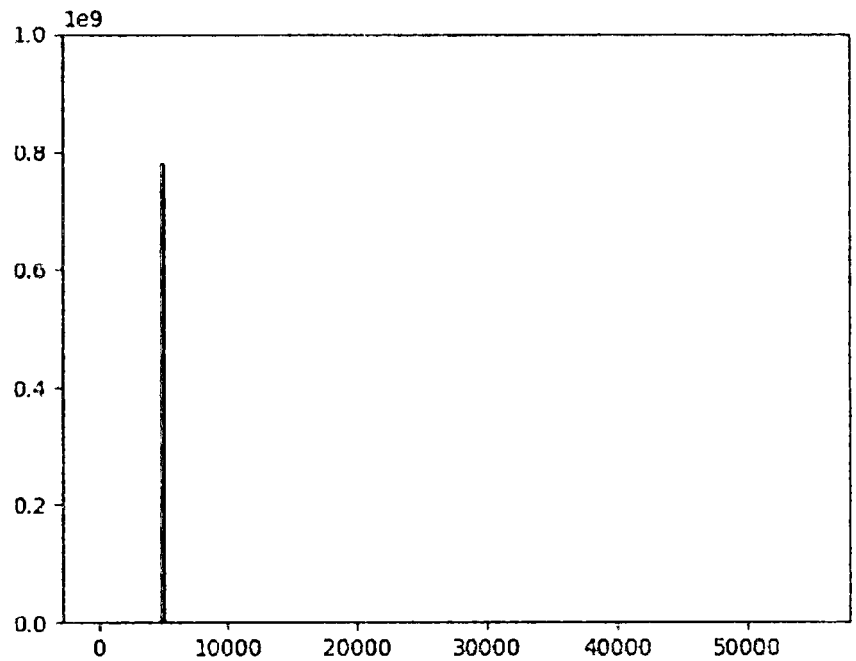
FIG. 14b: low frequency signal with a modified starting position.

The FIGS. 14a and 14b show how the frequency-hopping spread spectrum (FHSS)can be implemented by changing the starting position of the low frequency signal.

Figure 15:
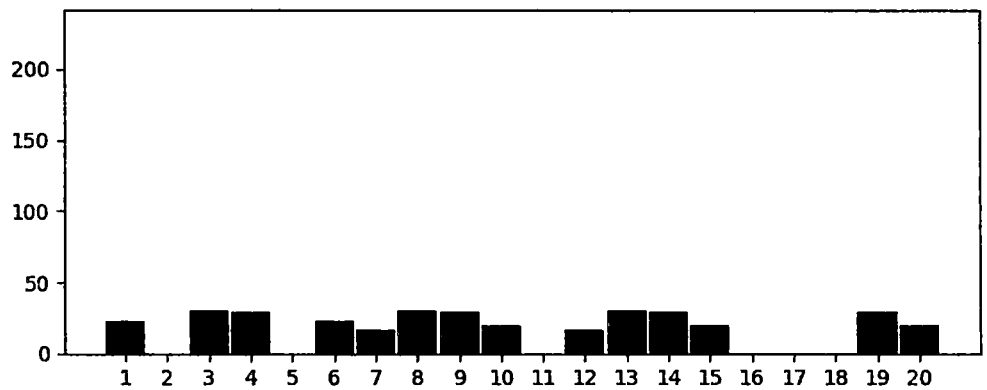
FIG. 15: bands in the frequency domain with unoccupied positions.

The FIG. 15 shows how the direct-sequence spread spectrum (DSSS) can be implemented by leaving some band positions unoccupied.

Figure 16A:
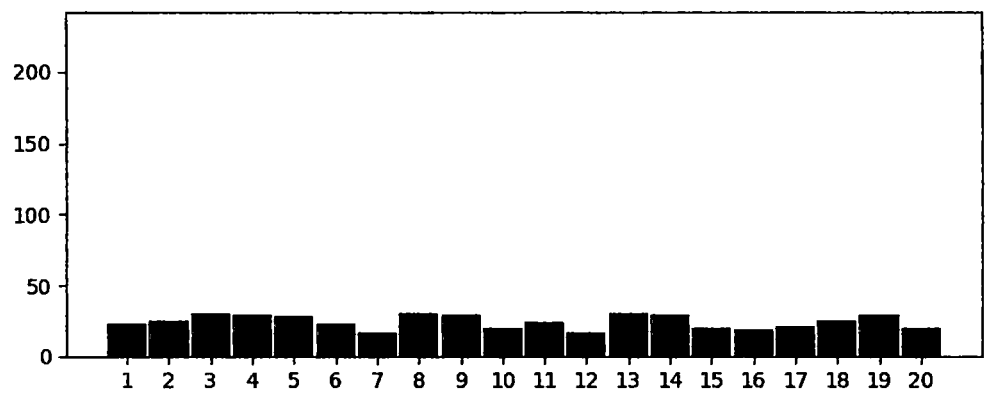
FIG. 16a: bands in the frequency domain without decimation.
Figure 16B:
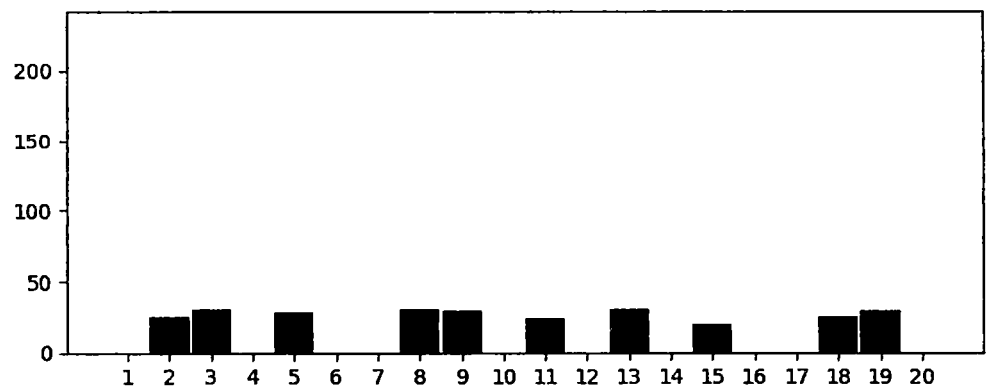
FIG. 16b: bands in the frequency domain with a simple decimation.
Figure 16C:
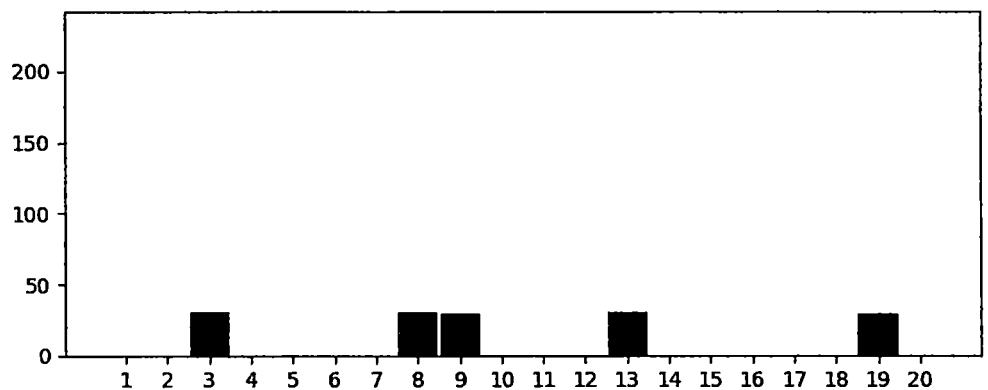
FIG. 16c: Bands in the frequency domain with a double decimation.
Figure 16D:
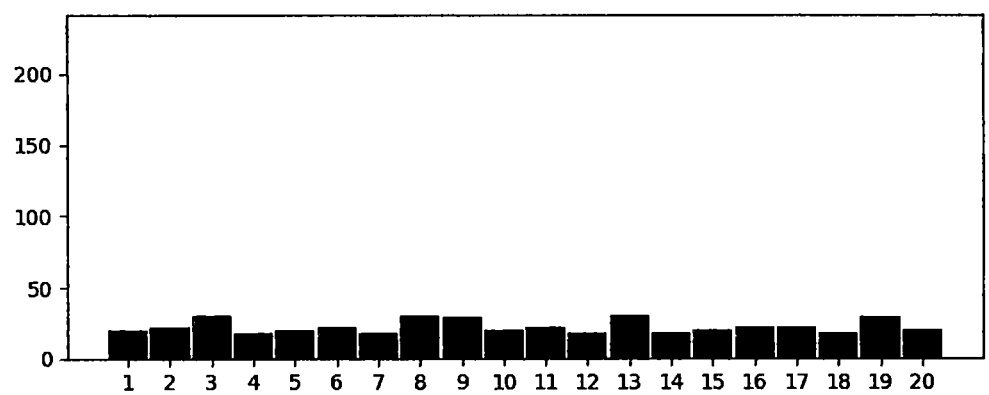
FIG. 16d: Bands in the frequency domain with a double decimation, carrying data.

The FIGS. 16b and 16c show examples of decimation in bands. The FIG. 16d shows how data can be transported instead of decimated points. The chosen magnitudes must remain lower than the non-decimated magnitudes.

Figure 17A:
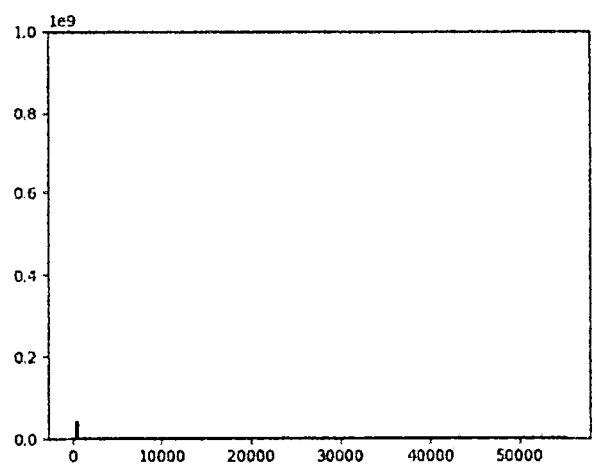
FIG. 17a: magnitudes of a signal in the frequency domain.
Figure 17B:
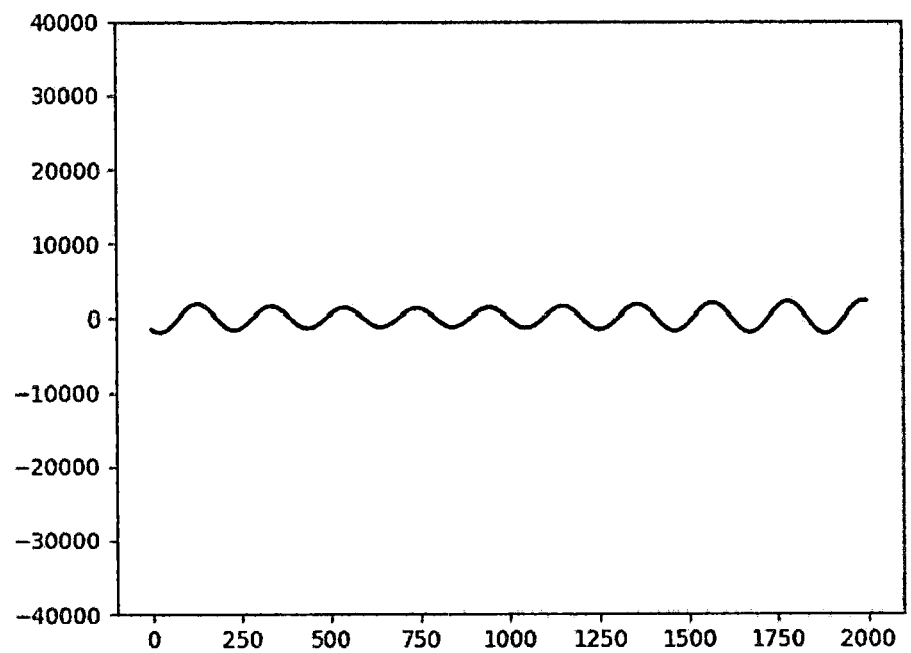
FIG. 17b: resulting signal in the time domain after applying random phases with sign.
Figure 17C:
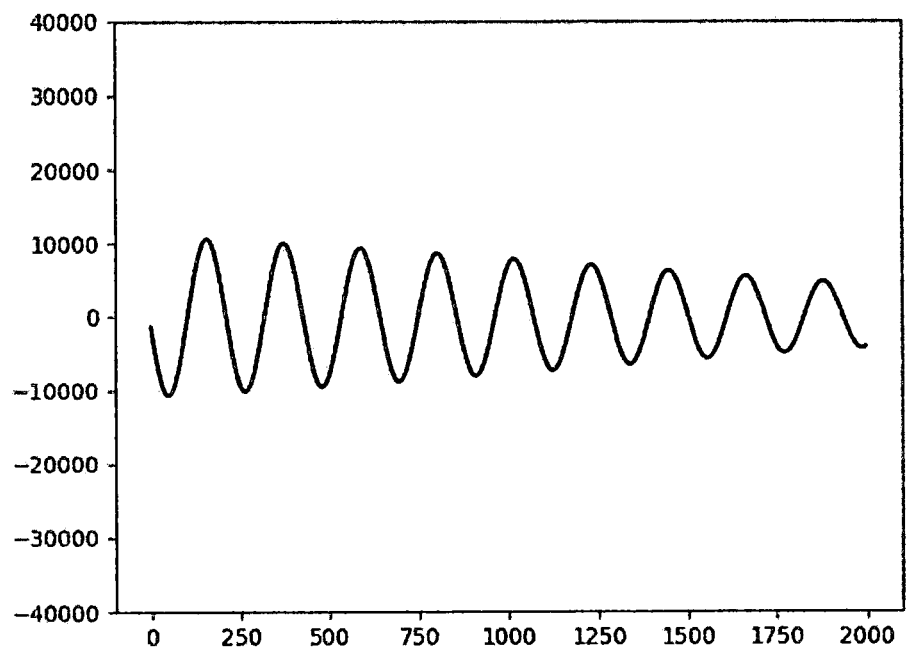
FIG. 17c: resulting signal in the time domain after applying the same random phases but without sign.

The FIGS. 17b and 17c show the influence of a simple optimization of the sign of the phase (random sign) on the resulting signal in order to control the maximum amplitude of the signal.

Figures 18, 19:
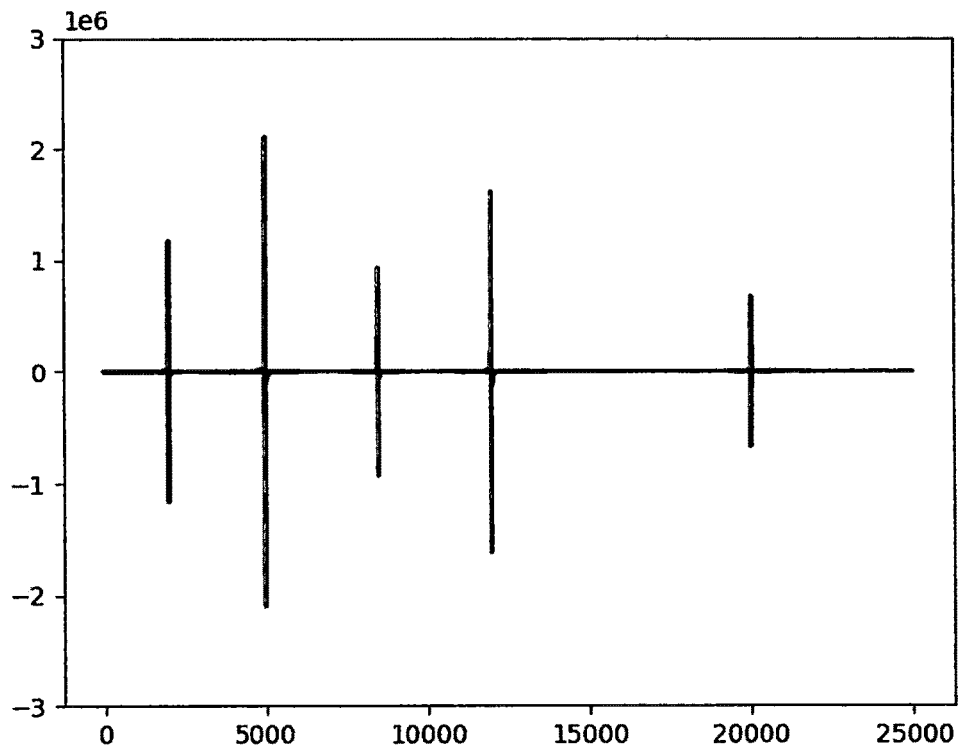
FIG. 18: a DCT-2 transformation of a signal with 5 main frequencies.
FIG. 19: several examples of mapping of a binary RLE output to a FFT output.

The FIG. 18 shows a DCT-2 transformation of a signal with 5 main frequencies. The UNB methods of this document can be applied to transformations such as DCT by considering their amplitudes as signed magnitudes.

The FIG. 19 shows a table with several examples of mapping of a binary RLE output to a FFT output. Depending on your needs, you can use the appropriate RLE (binary or more)—FFT mapping, in particular transporting the foreground into the background phases. We have chosen four phases for the successive repetitions, 0, PI/4, 2PI/4, 3PI/4, for 1, 2, 3 and 4 repetitions, where PI=3.14159265359, B=black pixel and W=white pixel.

The FIG. 20 shows a table with an example of mapping of a Huffman output to a FFT output. The Huffman coding can also be used to obtain a FFT output. We have chosen two phases for the successive repetitions, 0 and PI/2 for 1 and 2 repetitions.

Several types of applications are possible with the processes and methods of this document. We give below six simple examples.

First Example

Data from a sensor to be transmitted. We have a reading every three seconds and we must transmit every ten minutes. We therefore have FFT buffers of 200 points to consider.

We take FFT buffers of 200 or 256 points and we put the service data plus an exact value of the reading in the background phases.

Second Example

Voice communications or vital sign monitoring, using ultra-narrow bandwidth and analog amplitude modulation, or analog frequency modulation, or analog QAM.

12 to 16 local peaks with phase are enough to have a good quality.

We can be satisfied with sending 30 to 60 frames per second to respect the constraints of real time.

Third Example

Broadcasting multimedia data, using multiple frequencies or subcarriers, with analog or digital modulations, with independent analog or digital signal transmissions.

The frequencies or subcarriers must be well separated.

The foreground is also divided into bands. Pure data can be transported in the background using the phases.

Each band is associated with a frequency or subcarrier.

Fourth Example

Broadcasting multimedia data, using techniques similar to OFDM.

Intermediate subcarriers are used. Each band (foreground or background) is associated with a subcarrier by shifting the band to the subcarrier. The frequency at the center of the band can be chosen as the subcarrier frequency if a contiguous band area is taken.

Pure data can be transported in the background by using the phases.

iFFTs (inverse FFT) are performed in order to have a single time domain signal to send. A DAC (digital-analog) converter is used to send an analog signal. On the receiver side, on receiving the signal, after ADC (analog-to-digital) conversion, FFTs are carried out to recover the subcarriers.

Fifth Example

Pressing multimedia data onto optical discs, using analog frequency modulations, as for laserdisc (hollows engraved on disc).

Writing multimedia data to magnetic tapes, using analog frequency modulations, as for VHS (waveforms on tape).

Sixth Example

Creating a blockchain network, based on images. Semi-decentralized system, with a central authority playing an important role, but not controlling everything.

The processes and methods of this document are intended to be used in underwater communications, in satellite communications, in radar communications, in wireline communications, in wireless communications, with the dial-up telephone network, with the mobile network, with ADSL, with optical fiber, with LED bulbs, . . . ,
- were there is a need for thin beam for very long distance communications at low speed, low power and low radiation;
- where there is a need for high speed communications using techniques similar to OFDM or F-OFDM.

The invention claimed is:

1. A method of additional processing applied to multimedia
   codecs, audio, image and video compression methods, based solely on FFT, Fast Fourier Transform,
   using the largest points, the foreground,
   and the most energetic bands, the background,
   being able to use only a the largest local peaks field with or without phases,
   and being able to ignore the phases in the background, comprising:
   adding phases and using them to transport the values of the displacements of the local points and peaks in order to reduce the bandwidths, by generating a very narrow bandwidth signal;
   creating and transmitting UNB (Ultra Narrow Bandwidth) frames;
   adding phases in the background and using them to transport the points of the foreground in order to reduce the crest factor, by transporting the data directly into the reintroduced phases associated with the points;
   implementing the virtual decimation in the background bands and transmitting the entire frame with background bands.

2. The method of claim 1, wherein generating a very narrow bandwidth signal with the local points and peaks ignoring the phases comprises:
   associating new phases to the points;
   grouping the points so as to have a very narrow bandwidth;
   putting the displacements or the original positions of the points in the associated phases;
   synthesizing a new, relatively low-frequency, time-domain signal using an inverse FFT.

3. The method of claim 1, wherein taking into account the actual phases in the FFT sense of the local points and peaks, comprises:
   transforming the magnitudes and phases into sine amplitudes and cosine amplitudes;
   considering these amplitudes as magnitudes with sign;
   generating two separate low-frequency signals, each signal being considered as a signal without phase, and transmitting these signals;
   recovering the FFT phases from the received amplitudes.

4. The method of claim 1, wherein transporting the foreground data and additional pure data in the background bands comprises:
   leaving the points at their place, even if there are some null points due in particular to the absence of the points of the foreground;
   ignoring the phases in the FFT sense or taking only the sign of the phases in the bands;
   transporting the data directly into the reintroduced phases associated with the points.

5. The method of claim 1, wherein transmitting the entire frame with background bands comprises distributing the bins of the bands between several frequencies or several subcarriers, as in OFDM (Orthogonal Frequency-Division Multiplexing), and making a single inverse FFT.

6. The method of claim 1, wherein transporting the foreground points into the reintroduced background phases comprises the transport of the values of the magnitudes, positions and phases, or the values of the sine amplitudes, cosine amplitudes and positions.

7. The method of claim 1, wherein implementing the virtual decimation in the background bands comprises:
   using the non-decimable points to contain the magnitudes and the possible phases of the codec;
   using the phases and possibly the magnitudes of the decimable points to contain the data;
   ensuring that the magnitudes of the decimable points are not greater than those calculated.

8. The method of claim 1, wherein transporting UNB (Ultra Narrow Bandwidth) frames as OFDM FFT bins, instead of with analog or digital modulations, comprises:
   considering the magnitudes and the phases containing the displacements of the points as OFDM FFT bins, and placing them in OFDM subcarriers;
   using a known crest factor reduction technique, or simply optimizing the phase oppositions, or duplicating the symbols on other subcarriers, with or without interlacing, and optimizing the phase oppositions.

9. The method of claim 1, wherein creating and transmitting UNB frames and wherein moving back to the starting domain comprises using transforms as DCT (Discrete Cosine Transform), MDCT (Modified Discrete Cosine Transform), and real DWT (Discrete Wavelet Transform).

* * * * *